(12) United States Patent
Park et al.

(10) Patent No.: US 12,414,234 B2
(45) Date of Patent: Sep. 9, 2025

(54) ELECTRONIC DEVICE INCLUDING CONDUCTIVE FIXING MEMBER

(71) Applicant: Samsung Electronics Co., Ltd., Suwon-si (KR)

(72) Inventors: Jeonggyun Park, Suwon-si (KR); Seungjae Ahn, Suwon-si (KR); Youngduck Jung, Suwon-si (KR); Hyoseok Na, Suwon-si (KR); Youngbaek Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 397 days.

(21) Appl. No.: 17/887,834

(22) Filed: Aug. 15, 2022

(65) Prior Publication Data

US 2023/0112105 A1    Apr. 13, 2023

Related U.S. Application Data

(63) Continuation of application No. PCT/KR2022/007350, filed on May 24, 2022.

(30) Foreign Application Priority Data

Oct. 7, 2021    (KR) .......................... 10-2021-0133110

(51) Int. Cl.
*H05K 5/00* (2025.01)
*H01Q 1/24* (2006.01)
(Continued)

(52) U.S. Cl.
CPC ............. *H05K 1/118* (2013.01); *H01Q 1/243* (2013.01); *H01Q 1/38* (2013.01); *H01R 12/52* (2013.01);
(Continued)

(58) Field of Classification Search
CPC .......... H01Q 1/243; H01Q 1/38; H01R 12/52; H01R 24/50; H01R 2201/02; H05K 1/18; H05K 5/006; H05K 2201/09809
See application file for complete search history.

(56) References Cited

U.S. PATENT DOCUMENTS

| | | | |
|---|---|---|---|
| 4,115,779 A * | 9/1978 | Dantzler | ................ H01Q 1/084 343/882 |
| 7,564,412 B2 * | 7/2009 | Walker | ................. H01Q 1/2266 343/702 |

(Continued)

FOREIGN PATENT DOCUMENTS

| | | |
|---|---|---|
| CN | 110797678 | 2/2020 |
| JP | 2002-252479 | 9/2002 |

(Continued)

OTHER PUBLICATIONS

International Search Report and Written Opinion of the International Searching Authority for PCT/KR2022/007350 mailed Aug. 30, 2022 and English translation, 8 pages.

*Primary Examiner* — Vanessa Girardi
(74) *Attorney, Agent, or Firm* — Nixon & Vanderhye P.C.

(57) ABSTRACT

According to an embodiment of the disclosure, an electronic device may comprise: a housing including a front surface facing a first direction, a rear surface facing in a second direction opposite to the first direction, and a side structure including a side surface at least partially surrounding a space between the front surface and the rear surface, a coaxial cable at least partially disposed in the housing, a fixing member comprising a conductive material having electrical conductivity and disposed in the housing surrounding at least a portion of the coaxial cable, and an electrical/electronic component disposed in the housing and including a body portion at least partially disposed in the housing and a flexible printed circuit board extending from the body (Continued)

portion. The fixing member may be configured to electrically connect the coaxial cable and the flexible printed circuit board with the housing.

18 Claims, 19 Drawing Sheets

(51) Int. Cl.
    *H01Q 1/38*     (2006.01)
    *H01R 12/52*     (2011.01)
    *H01R 24/50*     (2011.01)
    *H05K 1/11*     (2006.01)
    *H05K 1/18*     (2006.01)

(52) U.S. Cl.
    CPC ............. *H01R 24/50* (2013.01); *H05K 1/189* (2013.01); *H05K 5/006* (2013.01); *H01R 2201/02* (2013.01); *H05K 2201/09809* (2013.01)

(56) References Cited

U.S. PATENT DOCUMENTS

| | | | |
|---|---|---|---|
| 7,876,274 B2 * | 1/2011 | Hobson | H01Q 1/38 |
| | | | 343/702 |
| 8,269,674 B2 * | 9/2012 | Camacho | G06F 1/1616 |
| | | | 343/702 |
| 10,206,299 B2 * | 2/2019 | Kim | H05K 7/1427 |
| 11,800,600 B2 * | 10/2023 | Tan | G06F 1/182 |
| 2007/0035456 A1 | 2/2007 | Jeong | |
| 2011/0080696 A1 | 4/2011 | Nishikawa et al. | |
| 2011/0273339 A1 | 11/2011 | Hornung | |
| 2014/0104118 A1 | 4/2014 | Kim | |
| 2017/0164498 A1 | 6/2017 | Song et al. | |
| 2017/0172005 A1 | 6/2017 | Kim et al. | |
| 2020/0127404 A1 | 4/2020 | Seo et al. | |
| 2020/0267868 A1 | 8/2020 | Park | |
| 2021/0006648 A1 | 1/2021 | Han et al. | |
| 2021/0298165 A1 | 9/2021 | Jeon | |

FOREIGN PATENT DOCUMENTS

| | | |
|---|---|---|
| JP | 2015-050416 | 3/2015 |
| KR | 10-2007-0018511 | 2/2007 |
| KR | 10-1091884 | 12/2011 |
| KR | 10-2017-0066990 | 6/2017 |
| KR | 10-2017-0097917 | 8/2017 |
| KR | 10-2018-0088172 | 8/2018 |
| KR | 10-1918298 | 11/2018 |
| KR | 10-2019-0103814 | 9/2019 |
| KR | 10-2019-0139597 | 12/2019 |
| KR | 10-2020-0012153 | 2/2020 |
| KR | 10-2020-0045661 | 5/2020 |
| KR | 10-2021-0108741 | 9/2021 |

* cited by examiner

ELECTRONIC DEVICE INCLUDING CONDUCTIVE FIXING MEMBER

CROSS-REFERENCE TO RELATED APPLICATIONS

This application is a continuation of International Application No. PCT/KR2022/007350 designating the United States, filed on May 24, 2022, in the Korean Intellectual Property Receiving Office and claiming priority to Korean Patent Application No. 10-2021-0133110, filed on Oct. 7, 2021, in the Korean Intellectual Property Office, the disclosures of which are incorporated by reference herein in their entireties.

BACKGROUND

Field

The disclosure relates to an electronic device, e.g., an electronic device including a conductive fixing member.

Description of Related Art

The term "electronic device" may refer, for example, to a device performing a particular function according to its equipped program, such as a home appliance, an electronic scheduler, a portable multimedia player, a mobile communication terminal, a tablet PC, a video/sound device, a desktop PC or laptop computer, a navigation for automobile, etc. For example, electronic devices may output stored information as voices or images. As electronic devices are highly integrated, and high-speed or high-volume wireless communication becomes commonplace, an electronic device, such as a mobile communication terminal, is recently being equipped with various functions. For example, an electronic device comes with the integrated functionality, including an entertainment function, such as playing video games, a multimedia function, such as replaying music/videos, a communication and security function for mobile banking, and/or a scheduling or e-wallet function. As the electronic device is highly integrated, portability is further enhanced, and wearable electronic devices, such as wrist-type or glasses-type electronic devices, have been commercialized, and electronic devices are more comfortably carried and used.

The above-described information may be provided as background for the purpose of helping understanding of the disclosure. No claim or determination is made as to whether any of the foregoing is applicable as background art in relation to the disclosure.

It may be difficult to provide a stable operating environment in a downsized electronic device, such as a mobile communication terminal or a tablet PC. For example, an electric shock, such as static electricity, may cause malfunction or damage to various integrated circuit chips or electric/electronic components, and may cause discomfort to the user.

SUMMARY

Embodiments of the disclosure provide an electronic device having a stable operating environment by including a conductive fixing member.

Embodiments of the disclosure provide an electronic device capable of suppressing or preventing/reducing malfunction or damage to an electrical/electronic component due to static electricity.

According to an example embodiment of the disclosure, an electronic device may comprise: a housing including a front surface, a rear surface facing in a direction opposite to the front surface, and a side structure including a side surface at least partially surrounding a space between the front surface and the rear surface, a coaxial cable at least partially disposed in the housing, a fixing member comprising a conductive material and having electrical conductivity and disposed in the housing surrounding at least a portion of the coaxial cable, and an electrical/electronic component disposed in the housing and including a body portion at least partially disposed in the housing and a flexible printed circuit board extending from the body portion. The fixing member may be configured to electrically connect the coaxial cable and the flexible printed circuit board with the housing.

According to an example embodiment of the disclosure, an electronic device may comprise: a rear plate, a frame-shaped side structure comprising a side wall disposed corresponding to an edge of the rear plate, a coaxial cable at least partially disposed on the side structure in an area facing the rear plate, a fixing member comprising a conductive material disposed on the side structure and surrounding at least a portion of the coaxial cable, and an electrical/electronic component disposed in the housing and including a body portion at least partially disposed on the rear plate and a flexible printed circuit board extending from the body portion and configured to be disposed on an inner surface of the rear plate to contact the fixing member. The fixing member may be configured to electrically connect the coaxial cable and the flexible printed circuit board with the side structure.

According to an example embodiment, the fixing member electrically connects a coaxial cable or a flexible printed circuit board for transmitting various signals to a conductive structure (e.g., the housing), thereby mitigating the user's electric shock or discomfort due to static electricity.

In various example embodiments, the fixing member may suppress electromagnetic interference or noise generation and provide a stable operating environment by providing a stable grounding environment for adjacent other electrical/electronic components and/or various signal lines.

In an example embodiment, the fixing member may be easily installed or assembled even in a narrow space and may be easy to repair/replace.

Other aspect(s), advantage(s) and major configuration(s) of the disclosure will become apparent to one of ordinary skill in the art from the following detailed description of various example embodiments with reference to the accompanying drawings.

BRIEF DESCRIPTION OF THE DRAWINGS

The above and other aspects, features, and/or advantages of certain embodiments of the present disclosure will be more apparent from the following detailed description, taken in conjunction with the accompanying drawings, in which.

Throughout the drawings, like reference numerals may be assigned to like parts, components, and/or structures.

DETAILED DESCRIPTION

Figure 1:
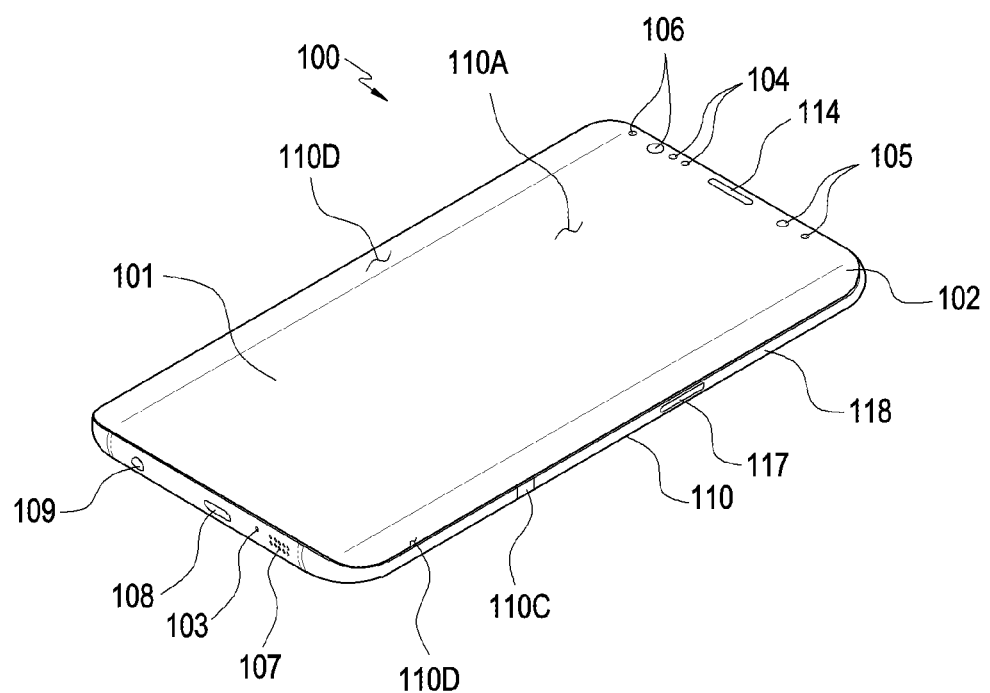
FIG. 1 is a front perspective view illustrating an electronic device.

The following description taken in conjunction with the accompanying drawings may be presented to provide an understanding of various implementations of the disclosure. The various example embodiments disclosed in the following description entail various specific details to aid understanding, but are regarded as one of various embodiments. Accordingly, it will be apparent to those skilled in the art that various changes and modifications may be made to the various implementations described in the disclosure without departing from the scope and spirit of the disclosure. Further, descriptions of well-known functions and configurations may be omitted for clarity and brevity.

The terms and words used in the following description and claims are not limited to the bibliographical meaning, but may be used to clearly and consistently describe the various embodiments of the disclosure. Therefore, it will be apparent to those skilled in the art that the following description of various implementations of the disclosure is provided only for the purpose of description, not for the purpose of limiting the disclosure.

The singular forms "a," "an," and "the" are intended to include the plural forms as well, unless the context clearly indicates otherwise. Thus, as an example, "a component surface" may be interpreted as including one or more of the surfaces of a component.

The electronic device according to various embodiments of the disclosure may be various types of devices. The electronic devices may include, for example, a portable communication device (e.g., a smart phone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program) including one or more instructions that are stored in a storage medium (e.g., internal memory or external memory) that is readable by a machine (e.g., the electronic device). For example, a processor of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
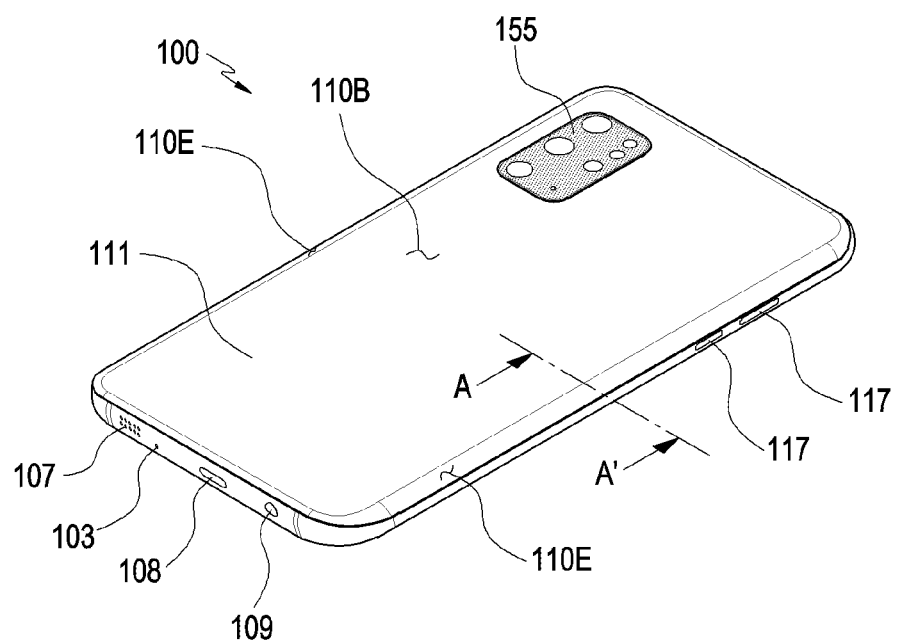
FIG. 2 is a rear perspective view thereof.

FIG. 1 is a front perspective view illustrating an electronic device 100 according to various embodiments. FIG. 2 is a rear perspective view illustrating an electronic device 100 according to various embodiments.

Referring to FIGS. 1 and 2, the electronic device 100 according to an embodiment may include a housing 110 including a first surface (or front surface) 110A, a second surface (or rear surface) 110B, and a side surface 110C surrounding a space the first surface 110A and the second surface 110B. According to an embodiment (not shown), the housing may denote a structure forming the first surface 110A of FIG. 1, the second surface 110B of FIG. 2, and some of the side surfaces 110C of FIG. 1. According to an embodiment, the first surface 110A may be formed by a front plate 102 (e.g., a glass plate or polymer plate with various coat layers) at least part of which is substantially transparent. According to an embodiment, the front plate 102 may be coupled with the housing 110 and, along with the housing 110, may form an internal space. According to various embodiments, the 'internal space' may refer, for example, to a space, as an internal space of the housing 110, for receiving at least part of the display 101.

According to an embodiment, the second surface 110B may be formed of a substantially opaque rear plate 111. The rear plate 111 may be formed of, e.g., laminated or colored glass, ceramic, polymer, metal (e.g., aluminum, stainless steel (STS), or magnesium), or a combination of at least two thereof. The side surface 110C may be formed by a side bezel structure (or a "side structure") 118 that couples to the front plate 102 and the rear plate 111 and includes a metal and/or polymer. According to various embodiments, the rear plate 111 and the side bezel structure 118 may be integrally formed together and include the same or similar material (e.g., a metal, such as aluminum).

In the embodiment illustrated, the front plate 102 may include two first areas 110D (e.g., curved areas), which seamlessly and bendingly extend from the first surface 110A to the rear plate 111, on both the long edges of the front plate 102. In the embodiment illustrated, the rear plate 111 may include second areas 110E (e.g., curved areas), which seamlessly and bendingly extend from the second surface 110B to the front plate 102, on both the long edges. According to various embodiment, the front plate 102 (or the rear plate 111) may include only one of the first areas 110D (or the second areas 110E). In an embodiment, some of the first areas 110D or the second areas 110E may not be included. In the above-described embodiments, at side view of the electronic device 100, the side bezel structure 118 may have a first thickness (or width) for sides (e.g., the side where the connector hole 108 is formed) that do not have the first areas 110D or the second areas 110E and a second thickness, which is smaller than the first thickness, for sides (e.g., the side where the key input device 117 is disposed) that have the first areas 110D or the second areas 110E.

According to an embodiment, the electronic device 100 may include at least one or more of a display 101, audio modules 103, 107, and 114, a sensor module 104, camera modules 105 and 155, a key input device 117, a light emitting device 106, and connector holes 108 and 109. According to various embodiments, the electronic device 100 may exclude at least one (e.g., the key input device 117 or the light emitting device 106) of the components or may add other components.

The display 101 may be visible through a significant portion of the front plate 102. According to an embodiment, at least a portion of the display 101 may be visible through the front plate 102 forming the first surface 110A and the first areas 110D of the side surface 110C. According to various embodiments, the edge of the display 101 may be formed to be substantially the same in shape as an adjacent outer edge of the front plate 102. According to an embodiment (not shown), the interval between the outer edge of the display 101 and the outer edge of the front plate 102 may remain substantially even to give a larger area of exposure the display 101.

According to an embodiment, the screen display area (e.g., the active area), or an area (e.g., the inactive area) off the screen display area, of the display 101 may have a recess or opening in a portion thereof, and at least one or more of the audio module 114, sensor module 104, camera modules 105 and 155, and light emitting device 106 may be aligned with the recess or opening. According to an embodiment (not shown), at least one or more of the audio module 114, sensor module 104, camera modules 105 and 155, and light emitting device 106 may be included on the rear surface of the screen display area of the display 101. According to an embodiment, the display 101 may be disposed to be coupled with, or adjacent, a touch detecting circuit, a pressure sensor capable of measuring the strength (pressure) of touches, and/or a digitizer for detecting a magnetic field-type stylus pen. According to an embodiment, at least part of the sensor module 104 and/or at least part of the key input device 117 may be disposed in the first areas 110D and/or the second areas 110E.

The audio modules 103, 107, and 114 may include a microphone hole 103 and speaker holes 107 and 114. The microphone hole 103 may have a microphone inside to obtain external sounds. According to an embodiment, there may be a plurality of microphones to be able to detect the direction of a sound. The speaker holes 107 and 114 may include an external speaker hole 107 and a phone receiver hole 114. According to an embodiment, the speaker holes 107 and 114 and the microphone hole 103 may be implemented as a single hole, or speakers may be rested without the speaker holes 107 and 114 (e.g., piezo speakers).

The sensor module 104 may produce an electrical signal or data value corresponding to the internal operation state or external environment state of the electronic device 100. The sensor module 104 may include a first sensor module 104 (e.g., a proximity sensor) and/or a second sensor module (not shown) (e.g., a fingerprint sensor) disposed on the first surface 110A of the housing 110 and/or another sensor module (not shown) (e.g., an HRM sensor or fingerprint sensor) disposed on the second surface 110B of the housing 110. The fingerprint sensor may be disposed on the second surface 110A as well as on the first surface 110B (e.g., the display 101) of the housing 110. The electronic device 100 may further include sensor modules not shown, e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 104.

The camera modules 105 and 155 may include a first camera device 105 disposed on the first surface 110A of the electronic device 100 and a second camera device 155 disposed on the second surface 110B. The second camera device 155 may include, e.g., an infrared light source, an infrared receiver, a flicker detection sensor, and/or a plurality of cameras. The camera modules 105 and 155 may include one or more lenses, an image sensor, and/or an image signal processor. A flash (not shown) may be disposed on the second surface 110B. The flash may include, e.g., a light emitting diode (LED) or a xenon lamp. According to an embodiment, two or more lenses (an infrared (IR) camera, a wide-angle lens, and a telescopic lens) and image sensors may be disposed on one surface of the electronic device 100.

The key input device 117 may be disposed on the side surface 110C of the housing 110. According to an embodiment, the electronic device 100 may exclude all or some of the above-mentioned key input devices 117 and the excluded key input devices 117 may be implemented in other forms, e.g., as soft keys, on the display 101.

The light emitting device 106 may be disposed on, e.g., the first surface 110A of the housing 110. The light emitting device 106 may provide, e.g., information about the state of the electronic device 100 in the form of light. According to an embodiment, the light emitting device 106 may provide a light source that interacts with, e.g., the camera module 105. The light emitting device 106 may include, e.g., a light emitting diode (LED), an infrared (IR) LED, or a xenon lamp.

The connector holes 108 and 109 may include a first connector hole 108 for receiving a connector (e.g., a universal serial bus (USB) connector) for transmitting or receiving power and/or data to/from an external electronic device and/or a second connector hole 109 (e.g., an earphone jack) for receiving a connector for transmitting or receiving audio signals to/from the external electronic device.

Figure 3:
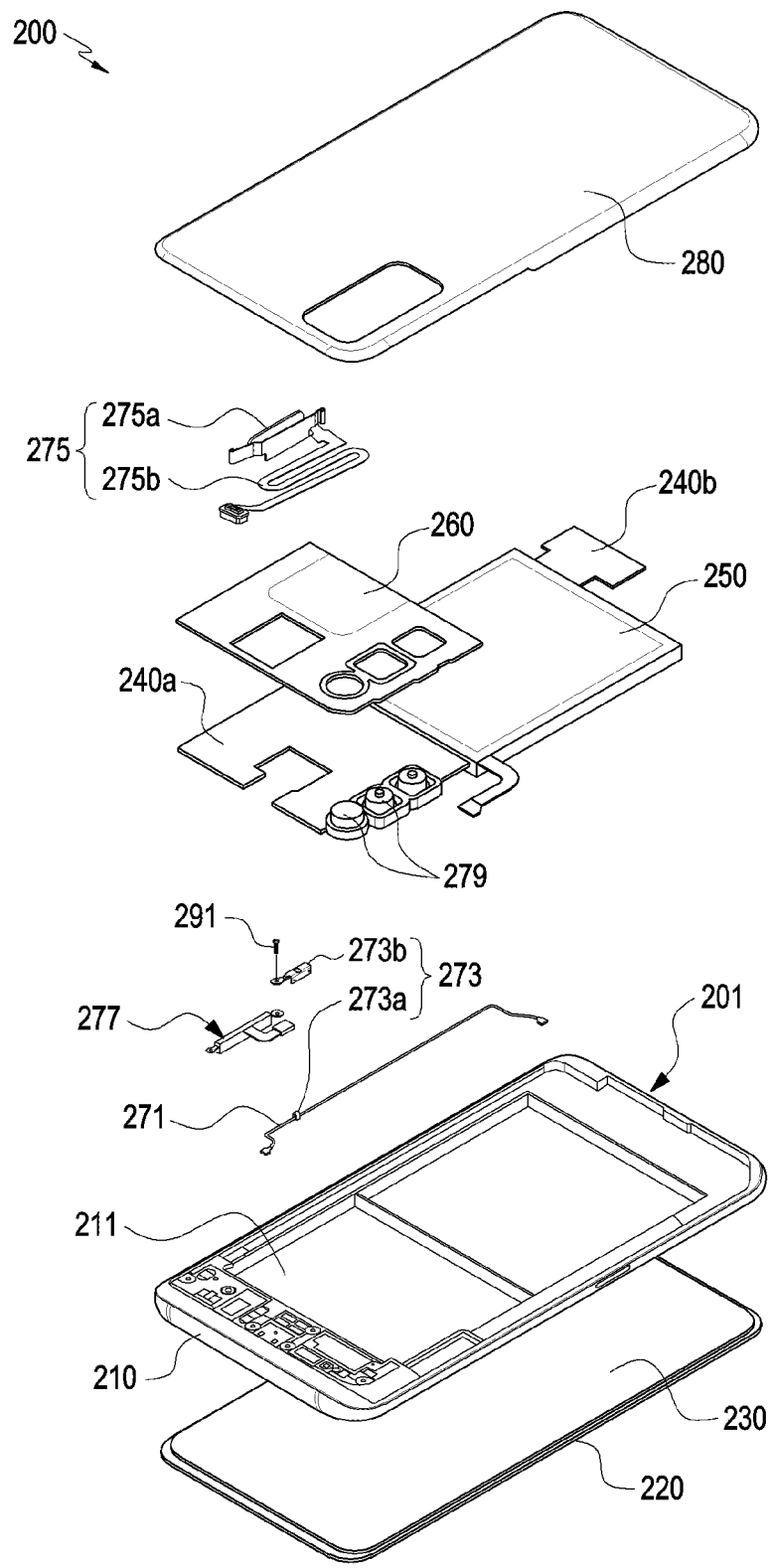
FIG. 3 is an exploded perspective view thereof.

FIG. 3 is an exploded perspective view illustrating an electronic device 200 (e.g., the electronic device 100 of FIG. 1 or 2) according to various embodiments.

Referring to FIG. 3, an electronic device 200 (e.g., the electronic device 100 of FIG. 1 or 2) may include a side structure 210 (e.g., the side surface 110C of FIG. 1 or 2), a first supporting member 211 (e.g., a bracket), a front plate 220, a display 230 (e.g., the display 101 of FIG. 1), a printed circuit board 240a and 240b, a battery 250, a second supporting member 260 (e.g., a rear case), an antenna (not shown), and/or a rear plate 280. The side surface 210 has, e.g., a frame shape at least partially surrounding the space between the front plate 220 and the rear plate 280 and be disposed on the edge of the front plate 220 and the rear plate 280. According to an embodiment, the electronic device 200 may exclude at least one (e.g., the first supporting member 211 or the second supporting member 260) of the components or may add other components. At least one of the components of the electronic device 200 may be the same or similar to at least one of the components of the electronic device 100 of FIG. 1 or 2 and no duplicate description is made below.

The first supporting member 211 may be disposed inside the electronic device 200 to be connected with the side structure 210 or integrated with the side structure 210. The first supporting member 211 may be formed of, e.g., a metallic material and/or non-metallic material (e.g., polymer). The display 230 may be joined onto one surface of the first supporting member 211, and the printed circuit board 240a and 240b may be disposed on the opposite surface of the first supporting member 211.

According to an embodiment, the printed circuit board 240a and 240b may include a first circuit board 240a disposed in a first area (e.g., an upper space of the battery 250 inside the electronic device 200) of the electronic device 200 or a second circuit board 240b disposed in a second area (e.g., a lower space of the battery 250 inside the electronic device 200). In the illustrated embodiment, the electronic device 200 may electrically connect the first circuit board 240a and the second circuit board 240b by including a coaxial cable 271. According to an embodiment, the electronic device 200 may further include at least one wiring member (e.g., a flexible printed circuit board or a ribbon cable) electrically connecting the first circuit board 240a and the second circuit board 240b. A processor, memory, and/or interface may be disposed on the printed circuit board 240a and 240b. The processor may include one or more of, e.g., a central processing unit, an application processor, a graphic processing device, an image signal processing, a sensor hub processor, or a communication processor.

According to an embodiment, the printed circuit board 240a and 240b, e.g., the first circuit board 240a and/or the second circuit board 240b may include a ground that provides a reference potential of the electronic device 200. For example, the ground may be implemented as a circuit pattern or a flat conductor included in the printed circuit board 240a and 240b. In various embodiments, when the housing 201 (e.g., the side structure 210, the first supporting member 211, and/or the second supporting member 260) includes a conductive material, the housing 210 may be electrically connected with the printed circuit board 240a and 240b (e.g., ground). For example, when the conductive material is included, the structure, such as the housing 201, may provide a stable operating environment by providing a ground of the electronic device 200.

According to an embodiment, the coaxial cable 271 may be disposed on or adjacent to the side structure 210. For example, the side structure 210 may include a slot (e.g., the slot 311 of FIGS. 5 to 7) (or slit) for wiring the coaxial cable 271 in at least a partial area of the surface facing the rear plate 280, and the coaxial cable 271 may be at least partially received in the slot 311 while one end of the coaxial cable 271 may be connected to the first circuit board 240a, and the other end thereof may be connected to the second circuit board 240b. In an embodiment, the electronic device 200 may include a fixing member 273 (e.g., a conductive gasket 273a and a first clamp 273b), thereby fixing the coaxial cable 271 to the side structure 210 while electrically connecting the coaxial cable 271 (e.g., an outer conductor of an inner conductor and the outer conductor of the coaxial cable 271) to the housing 201 or the side structure 210.

The memory may include, e.g., a volatile or non-volatile memory.

The interface may include, e.g., a high definition multimedia interface (HDMI), a universal serial bus (USB) interface, a secure digital (SD) card interface, and/or an audio interface. The interface may electrically or physically connect, e.g., the electronic device 200 with an external electronic device and may include a USB connector, an SD card/multimedia card (MMC) connector, or an audio connector.

The battery 250 may be a device for supplying power to at least one component of the electronic device 200. The battery 450 may include, e.g., a primary cell which is not rechargeable, a secondary cell which is rechargeable, or a fuel cell. At least a portion of the battery 250 may be disposed on substantially the same plane as the printed circuit board 240a and 240b. The battery 250 may be integrally or detachably disposed inside the electronic device 200.

An antenna not shown may be disposed between the rear plate 280 and the battery 250. The antenna may include, e.g., a near-field communication (NFC) antenna, a wireless charging antenna, and/or a magnetic secure transmission (MST) antenna. The antenna may perform short-range communication with, e.g., an external device or may wirelessly transmit or receive power necessary for charging. According to an embodiment of the present disclosure, an antenna structure may be formed by a portion or combination of the side structure 210 and/or the first supporting member 211.

According to an embodiment, the electronic device 200 may include various electrical/electronic components 275 and 279 and/or an additional antenna module 277. The electrical/electronic components 275 and 279 may include, e.g., a haptic module, a speaker module, a camera, a fingerprint sensor, a proximity sensor, an illuminance sensor, a touch sensor, a grip sensor, a light emitting element and/or a connector, and may be placed in an appropriate position according to the function or operation that each implements. The fingerprint sensor 275 illustrated by way of non-limiting example as one of the electrical/electronic components 275 and 279 may include a body portion 275a and a flexible printed circuit board 275b, and the body portion 275a may be disposed in a position adjacent to the coaxial cable 271 on the side structure 210. In an embodiment, the flexible printed circuit board 275b may extend from the body portion 275a to be electrically connected to the printed circuit board 240a and 240b. The antenna module 277 may be disposed, e.g., at least partially on the side structure 210 and be disposed to form a beam toward the outside of the housing 201. For example, the antenna module 277 may include an array antenna and may radiate a radio signal along the direction in which the side structure 210 faces. In various embodiments, in a direction parallel to the first surface (e.g., first surface 110A of FIG. 1) or second surface (e.g., second surface 110B of FIG. 2), the antenna module 277 may be disposed to face the outer space of the housing 201 or to form a beam toward the outside of the housing 201.

According to an embodiment, the camera 279 disposed as an example of the electrical/electronic component may be disposed on the first circuit board 240a or on a side of the first circuit board 240a. A plurality of cameras having different optical characteristics may be disposed adjacent to each other. In various embodiments, the cameras 279 may receive external light through a path passing through the second supporting member 260 and/or the rear plate 280.

In the illustrated embodiment, the fingerprint sensor 275 or the camera 279 is illustrated by way on non-limiting example as an example of the electrical/electronic component, but it should be noted that various embodiments of the disclosure are not limited thereto. Although not shown, as another example of the electrical/electronic component, a light emitting element may be disposed adjacent to the camera 279, and the light emitting element may provide illumination to the subject upon shooting by radiating light in the direction in which the camera 279 is oriented. For example, although not shown in the drawings, as mentioned above, the electronic device 200 may include various other types of electrical/electronic components, such as a haptic module, a speaker module, and/or a connector.

In the following description, the components easy to understand from the description of the above embodiments are denoted with or without the same reference numerals and their detailed description may be skipped. In the following description of embodiments, the configuration of the above-described electronic device may be referred to as necessary. In various embodiments, reference number '275' assigned as a fingerprint sensor may be utilized as a reference number illustrating an electrical/electronic component.

Figure 4:
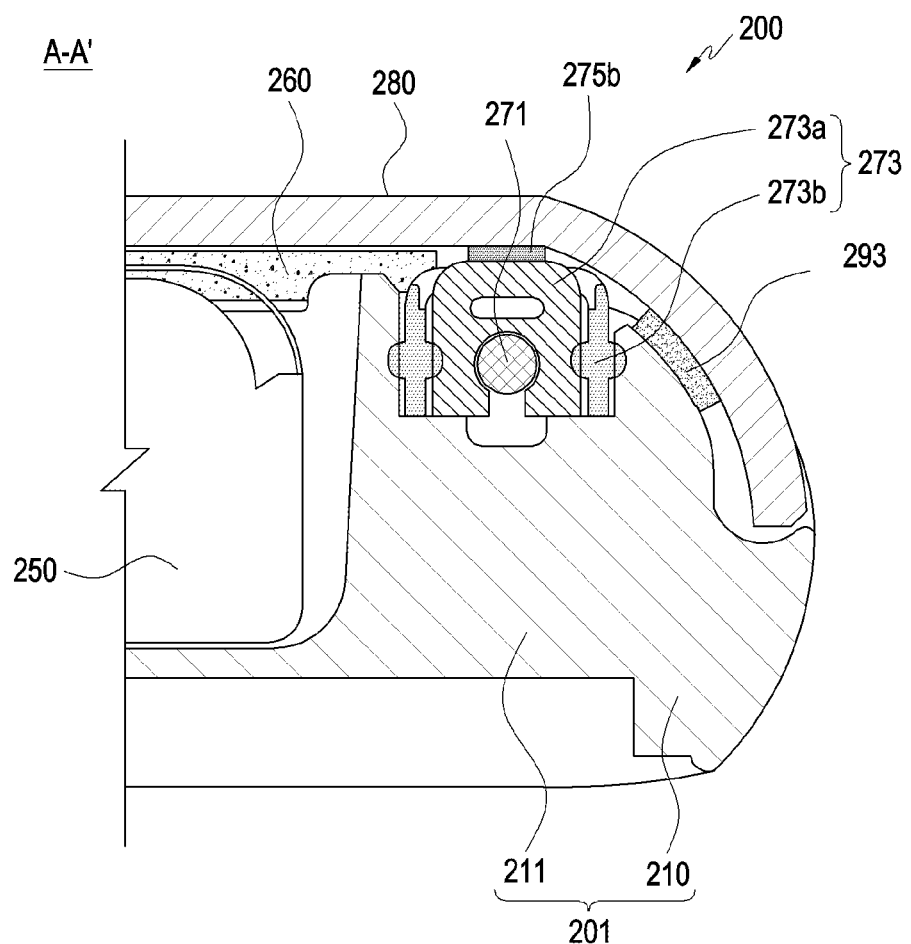
FIG. 4 is a cross-sectional view illustrating a portion of an electronic device.

FIG. 4 is a cross-sectional view illustrating a portion of an electronic device 200 (e.g., the electronic device 100 of FIG. 1 or 2) according to various embodiments. FIG. 4 is a cross-sectional view illustrating a portion of the edge of the electronic device 100 or 200, taken along line A-A' of FIG. 2 according to various embodiments.

Referring to FIG. 4, the coaxial cable 271 or the fixing member 273 may be disposed on the side structure 210 in a state of at least partially facing the rear plate 280. For example, the rear plate 280 may be coupled to a portion of the side structure 210 by a coupling member 293, such as a double-sided tape, and when viewed in cross-sectional view, the coaxial cable 271 or the fixing member 273 may be substantially disposed inside the space surrounded by the side structure 210 and the rear plate 280. When viewed from the rear surface (e.g., the second surface 110B of FIG. 2) of the electronic device 200, the coupling member 293 may have a substantially closed loop shape and may form a waterproof structure between the housing 201 and the rear plate 280.

According to an embodiment, the coaxial cable 271 may be disposed or fixed on the side structure 210 by the fixing member 273, and the fixing member 273 may be formed of a conductive material to electrically connect the coaxial cable 271 to the housing 201 or the side structure 210. The housing 201, e.g., the side structure 210 and/or the first supporting member 211, may be at least partially formed of a conductive material and may thus serve as a ground for the electronic device 200, and the coaxial cable 271 may be electrically connected to the housing 201. In various embodiments, when the flexible printed circuit board 275b of the electrical/electronic component 275 is disposed on or adjacent to the side structure 210, the flexible printed circuit board 275b may be disposed in contact with the fixing member 273 and be electrically connected to the housing 210 through the fixing member 273. For example, since at least the coaxial cable 271 and/or the flexible printed circuit board 275b is electrically connected to a common ground (e.g., the housing 201) inside the electronic device 200, it is possible to suppress noise in various signal transmissions and suppress or prevent damage to the electrical/electronic components 275 and 279, such as a fingerprint sensor or a camera.

According to an embodiment, the coaxial cable 271 may be electrically connected to the housing 201 (e.g., the side structure 210) via the fixing member 273, e.g., a conductive gasket 273a and, in an embodiment, the coaxial cable 271 may be electrically connected to the housing 201 through the conductive gasket 273a and the first clamp 273b. In various embodiments, in a structure in which the coaxial cable 271 and the housing 201 are electrically connected via the conductive gasket 273a, the first clamp 273b may be formed of an insulating material. As is described below, the first clamp 273b together with a second clamp (e.g., the second clamp 277c of FIG. 5) of the antenna module 277 may be fastened or bound to the side structure 210, and as the first clamp 273b is formed of a conductive material, multiple electrical connection paths may be provided between the coaxial cable 271 (or flexible printed circuit board 275b) and the housing 201. According to an embodiment, the flexible printed circuit board 275b may be electrically connected to the housing 201 by being disposed at least partially in contact with the conductive gasket 273a. For example, the flexible printed circuit board 275b may include a ground (e.g., ground layer 675d of FIG. 20), and a portion of a conductor or printed circuit pattern serving as a ground may be disposed in direct contact with the conductive gasket 273a.

Figure 5:
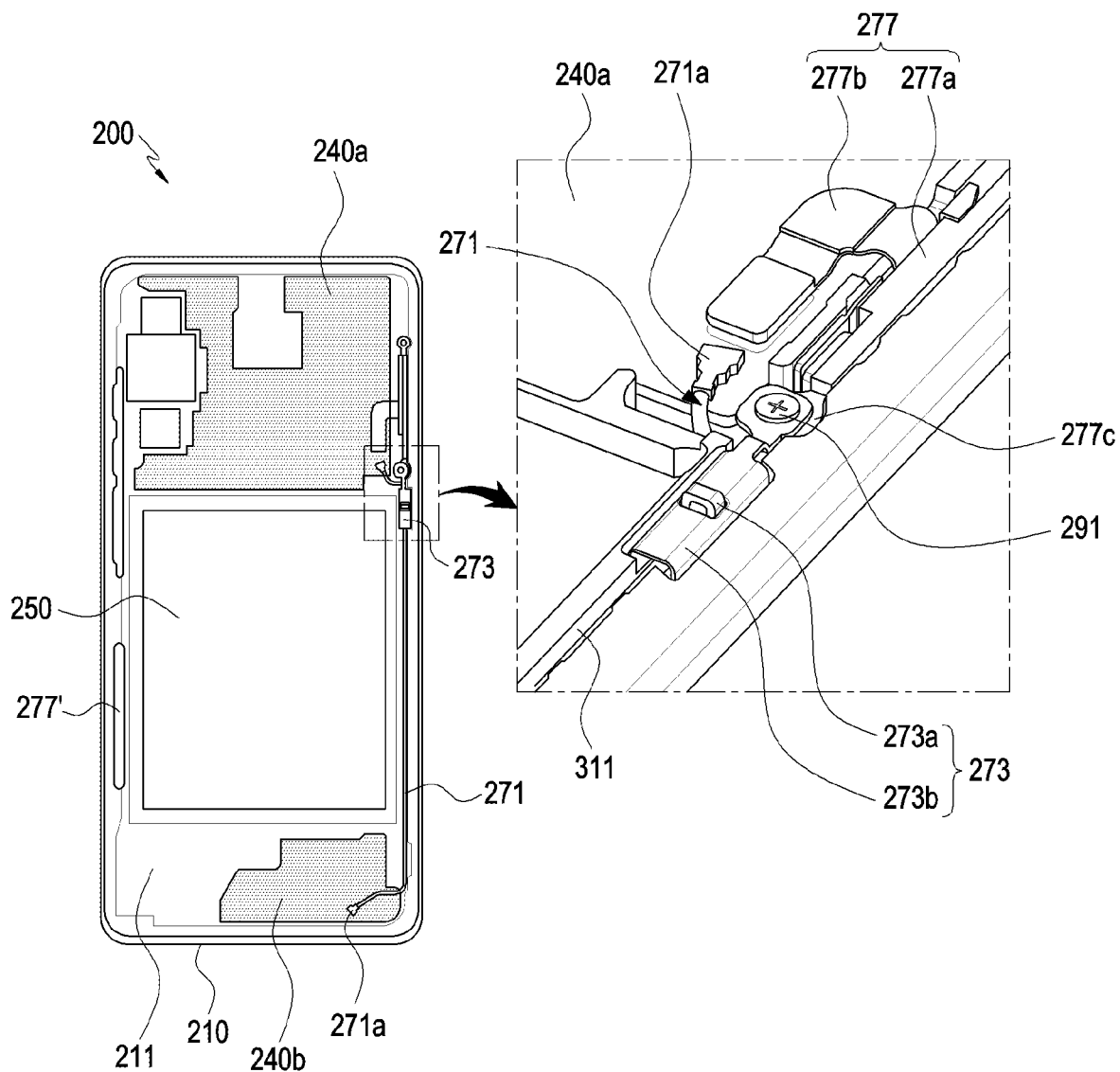
FIG. 5 is a diagram including a partial perspective view illustrating a placement of a fixing member in an electronic device.

FIG. 5 is a diagram including a partial perspective view illustrating a placement of a fixing member (e.g., the fixing member 273 of FIG. 3 or 4) in an electronic device 200 according to various embodiments.

Referring to FIG. 5, the electronic device 200 and/or the side structure 210 may include a slot 311 for receiving the coaxial cable 271 and/or the antenna module 277. The slot 311 may be formed, e.g., in an area facing the rear plate (e.g., the rear plate 280 of FIG. 3 or 4) in the surface of the side structure 210. In an embodiment, the coaxial cable 271 may be configured to transfer electrical signals between the first circuit board 240a disposed in the first area and the second circuit board 240b disposed in the second area, inside the electronic device 200. For example, the placement structure of the coaxial cable 271 bypasses the area where the battery 250 is disposed and uses the slot 311 formed in the side structure 210, so that substantially no influence may be had on the size or thickness of the electronic device 200. In various embodiments, a wiring structure (not shown) may be disposed to overlap the battery 250 to electrically connect the first circuit board 240a and the second circuit board 240b. As the wiring structure disposed to overlap the battery 250, e.g., a flat plate-type or film-type flexible printed circuit board or ribbon cable may be utilized.

According to an embodiment, the electronic device 200 may include a fixing member 273 for fixing the coaxial cable 271 to the side structure 210. The fixing member 273 may include, e.g., a conductive gasket 273a coupled to surround at least part of the coaxial cable 271 or a first clamp 273b fixing the conductive gasket 273a onto the side structure 210. The conductive gasket 273a may be formed of, e.g., an elastic material based on any one or a combination of two or more of fabric, polyurethane foam, or polyethylene terephthalate (PET). The first clamp 273b may be formed of, e.g., a metallic material, such as stainless steel. In an embodiment, in a structure in which the conductive gasket 273a is disposed in direct contact with the housing 201 (e.g., the side structure 210), the first clamp 273b may be formed of an insulating material and may bring the conductive gasket 273a in tight contact to the coaxial cable 271 or the side structure 210, on the side structure 210. In various embodiments, the first clamp 273b pressurizes the conductive gasket 273a into tight contact with the coaxial cable 271, and the rear plate 280 is coupled with the side structure 210, bringing the conductive gasket 273a in tight contact to the side structure 210.

According to an embodiment, the antenna module 277 may include an antenna substrate 277a and a wiring board 277b extending from the antenna substrate 277a. The antenna substrate 277a may include an array antenna including a plurality of radiation patches disposed or fixed to, e.g., the side structure 210 (e.g., a portion of the slot 311, indicated by '211a' of FIG. 6). In an embodiment, the antenna substrate 277a may be disposed on the side structure 210 so that the array antenna forms a beam toward an external space, and the slot 311 may be shaped to at least partially receive the antenna substrate 277a in an appropriate position. The wiring board 277b may be electrically connected to the first circuit board 240a while extending from the antenna substrate 277a. In various embodiments, the wiring board 277b may be formed substantially integrally with the antenna substrate 277a and may have higher flexibility than the antenna substrate 277a. In an embodiment, when the antenna module 277 transmits and receives a signal in a high frequency band up to several tens of GHz, the electronic device 200 may include an additional antenna module 277' disposed in a different position of the side structure 210. For example, to implement omnidirectionality in wireless communication, the electronic device 200 may include a plurality of antenna modules 277 and 277'.

According to an embodiment, the antenna module 277 may include at least one second clamp 277c. For example, the second clamp 277c may be formed to surround at least a portion of the antenna substrate 277a and may extend from the edge of the antenna substrate 277a and tightly contact or be fixed onto the side structure 210. In an embodiment, the second clamp 277c may be electrically connected to the housing 201 by directly contacting the side structure 210. For example, the antenna module 277 may be electrically connected to the housing 201 through the second clamp 277c. In various embodiments, a portion (e.g., the second fixing portion 473c of FIG. 11) of the first clamp 273b may be disposed to overlap a portion of the second clamp 277c. For example, the first clamp 273b may partially be fixed to the side structure 210 by the fastening member 291 (e.g., a screw), with a portion of the second clamp 277c disposed therebetween. In an embodiment, when the first clamp 273b has good conductivity, a portion of the second clamp 277c may be fixed to the side structure 210 by the fastening member 291 with a portion of the first clamp 273b disposed therebetween.

Hereinafter, an arrangement or assembly structure of the coaxial cable 271 and/or the electrical/electronic component 275 (e.g., the flexible printed circuit board 275b of FIG. 3) is described in greater detail below with reference to FIGS. 6 to 20.

Figure 6:
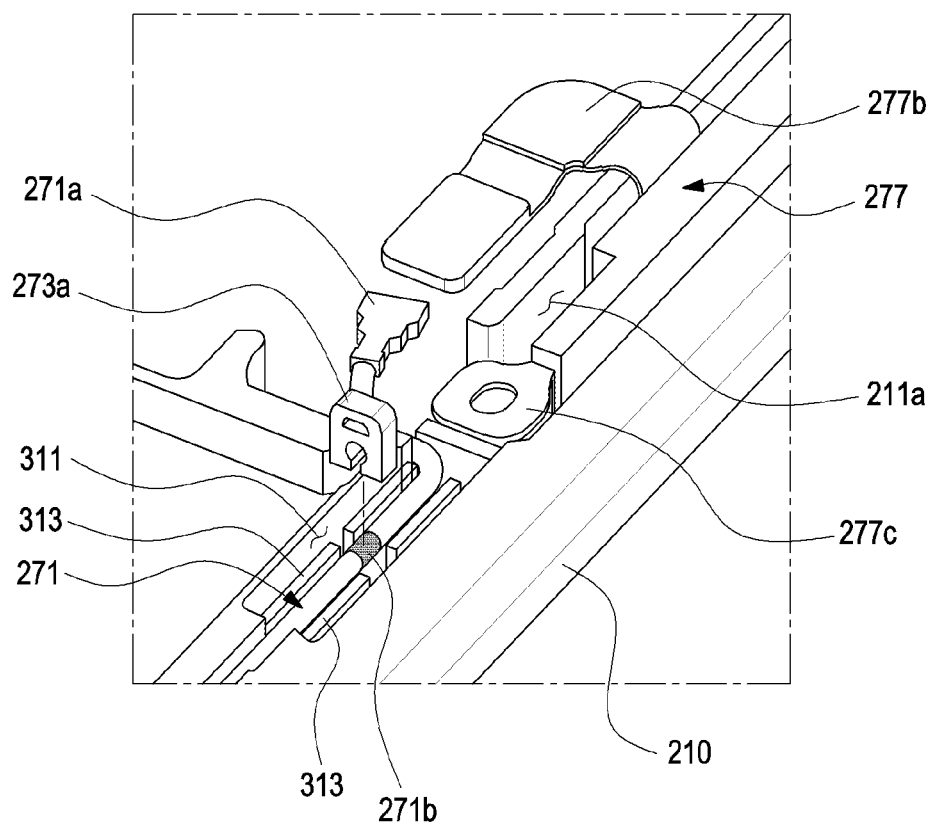
FIG. 6 is an exploded perspective view illustrating a placement of a portion of a fixing member in an electronic device.
Figure 7:
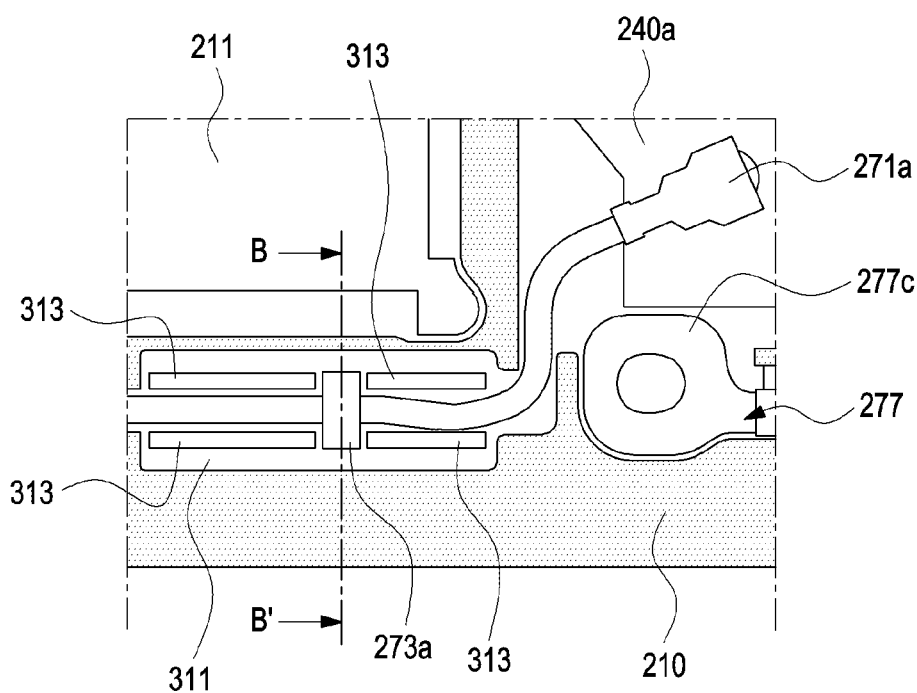
FIG. 7 is a diagram illustrating a placement of a portion of a fixing member in an electronic device.
Figure 8:
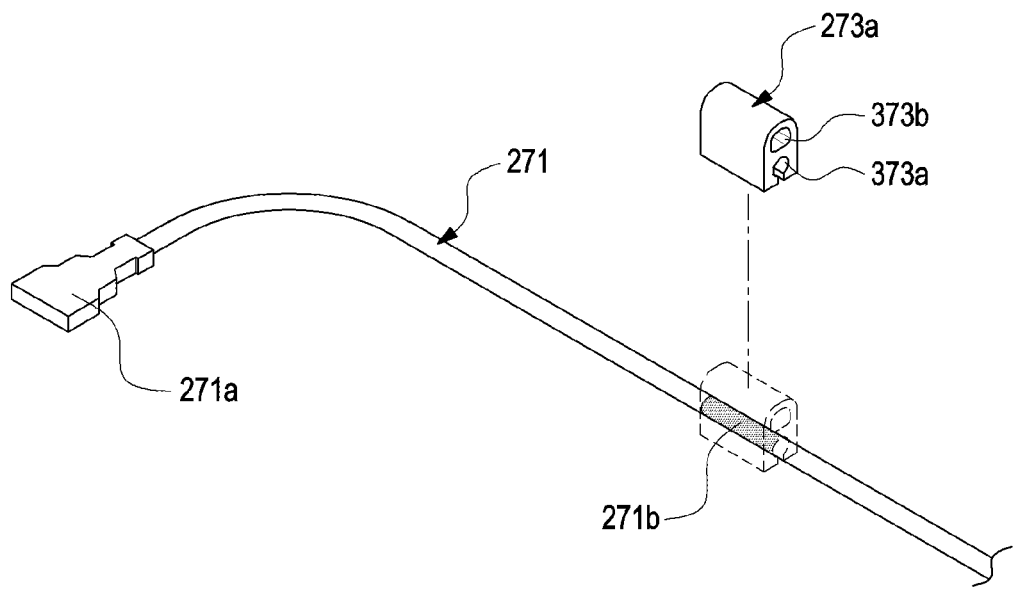
FIG. 8 is an exploded perspective view illustrating a coupling of a portion of a fixing member of an electronic device to a coaxial cable.
Figure 9:
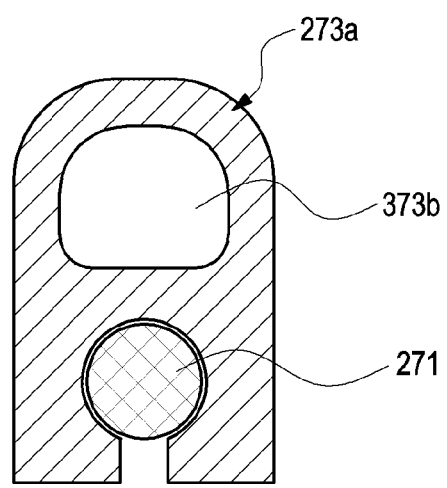
FIG. 9 is a cross-sectional view illustrating a coupling of a portion of a fixing member of an electronic device to a coaxial cable.
Figure 10:
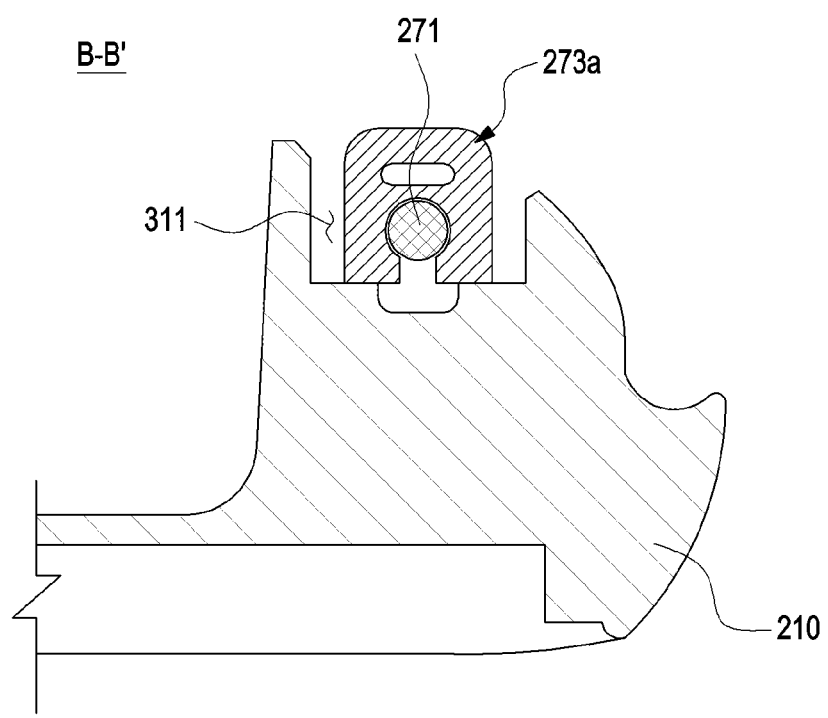
FIG. 10 is a cross-sectional view illustrating a portion of an electronic device, taken along line B-B' of FIG. 7.

FIG. 6 is an exploded perspective view illustrating a placement of a portion (e.g., the conductive gasket 273a) of a fixing member 273 in an electronic device (e.g., the electronic device 200 of FIGS. 3 to 5) according to various embodiments. FIG. 7 is a diagram illustrating a placement of a portion of a fixing member 273 in an electronic device 200 according to various embodiments. FIG. 8 is an exploded perspective view illustrating a coupling of a portion of a fixing member 273 of an electronic device 200 to a coaxial cable 271 according to various embodiments. FIG. 9 is a cross-sectional view illustrating a coupling of a portion of a fixing member 273 of an electronic device 200 to a coaxial cable 271 according to various embodiments. FIG. 10 is a cross-sectional view illustrating a portion of the electronic device 200, taken along line B-B' of FIG. 7 according to various embodiments.

Referring to FIGS. 6, 7, 8, 9 and 10 (which may be referred to as FIGS. 6 to 10), the coaxial cable 271 may be substantially received in the slot 311 and be electrically connected to a printed circuit board 240a and 240b, e.g., the first circuit board 240a or the second circuit board (e.g., the second circuit board 240b of FIG. 3 or 5), through a coaxial connector 271a provided at either or both ends. In an embodiment, the coaxial cable 271 is disposed substantially on the side structure 210, and both ends (e.g., the coaxial connector 271a) are disposed inside the space surrounded by the side structure 210 and may be coupled to the printed circuit board 240a and 240b. In an embodiment, the section of the slot 311, where the coaxial cable 271 is disposed, may at least partially or substantially have a width corresponding to the diameter of the cross section of the coaxial cable 271. For example, the coaxial cable 271 may be disposed in contact with the inner wall of the slot 311 and be fixed onto the side structure 210. In an embodiment, a portion of the section where the coaxial cable 271 is disposed may be formed to be larger than the cross-sectional diameter of the coaxial cable 271 and may thus receive the fixing member 273, e.g., the conductive gasket 273a or the first clamp 273b.

In an embodiment, in the section where the fixing member 273 is received, the electronic device 200 and/or the side structure 210 may include a plurality of partitions formed inside the slot 311. For example, in the slot 311, the partitions 313 may support or fix the coaxial cable 271, the conductive gasket 273a, and/or the first clamp 273b. According to an embodiment, referring to FIG. 7, the electronic device 200 and/or the side structure 210 may include four partitions 313 forming a 2 column x 2 row array. In various embodiments, the coaxial cable 271 may be disposed between two rows formed by the partitions 313, and the conductive gasket 273a may be disposed between two columns formed by the partitions 313. In an embodiment, the partitions 313 may protrude from the bottom of the slot 311 and be spaced apart from the inner wall of the slot 311. The gap formed between the partitions 313 and the inner wall of the slot 311 may be used as a space for receiving or fixing a portion of the first clamp 273b.

According to an embodiment, the conductive gasket 273a may be coupled to surround at least a portion (e.g., the first stripped portion 271b described below) of the coaxial cable 271 and be brought in tight contact to the bottom surface of the slot 311 by the rear plate 280. In an embodiment, as the conductive gasket 273a has a width larger than the slot 311, the conductive gasket 273a may be fixed to the slot 311 while in tight contact with the inner wall of the slot 311. For example, as compressed while being coupled to the slot by having a width larger than the slot 311 and being formed of an elastic material, the conductive gasket 273a may be brought in tight contact to the inner wall of the slot 311 and the outer circumferential surface of the coaxial cable 271. For example, depending on the size and shape of the conductive gasket 273a, the fixing member 273 may not include the first clamp 273b, and the coaxial cable 271 may be stably connected to the housing 201 by the conductive gasket 273a. As is described below, when another electrical/electronic component 275 or the antenna module 277 is disposed in a position adjacent to the fixing member 273, the first clamp 273b may be useful in providing a common ground to the coaxial cable 271, the other electrical/electronic component 275, and/or the antenna module 277.

According to an embodiment, the conductive gasket 273a may include a binding recess 373a for receiving a portion of the coaxial cable 271 and/or a dummy hole 373b formed in parallel with the binding recess 373a. The binding recess 373a may be formed through the conductive gasket 273a along the extending direction of, e.g., the coaxial cable 271, and be shaped to be exposed or opened to a lower surface (e.g., the surface facing the bottom of the slot 311) of the conductive gasket 273a. For example, the coaxial cable 271 may be received in the binding recess 373a from the lower surface of the conductive gasket 273a. In various embodiments, the binding recess 373a may have a diameter smaller than the cross-sectional diameter of the coaxial cable 271. For example, if the coaxial cable 271 is received in the binding recess 373a, the conductive gasket 273a may come in tight contact to the outer circumferential surface of the coaxial cable 271 (e.g., the outer circumferential surface of the first stripped portion 271b described below).

According to an embodiment, the dummy hole 373b may be disposed between the binding recess 373a and the rear plate 280 on the electronic device 200. In various embodiments, in a portion between the dummy hole 373b and the rear plate 280, the conductive gasket 273a may contact the flexible printed circuit board (e.g., the flexible printed circuit board 275b of FIG. 4) or the rear plate 280. The dummy hole 373b may stably maintain the contact state of the conductive gasket 273a and the flexible printed circuit board 275b and prevent/inhibit the rear plate 280 from being separated from the side structure 210 by the elastic force of the conductive gasket 273a. For example, the portion of the conductive gasket 273a surrounding the dummy hole 373b may be stably brought in contact to the flexible printed circuit board 275b and may accumulate significantly lower elastic force than the coupling force between the rear plate 280 and the side structure 210.

According to an embodiment, when electrically connected with the conductive gasket 273a or the side structure 210, the coaxial cable 271 may be partially stripped off in a designated position (hereinafter, a 'first stripped portion 271b'), exposing the outer conductor to the external space. For example, although not shown, the coaxial cable 271 may be structured to have an inner conductor for signal transmission and an outer conductor disposed to surround the inner conductor to provide electromagnetic shielding or reference potential and may include insulation layers disposed to surround the outer conductor and/or between the outer conductor and the inner conductor. In an embodiment, as the insulation layer surrounding the outer conductor is partially removed, the outer conductor of the coaxial cable 271 may be exposed from the first stripped portion 271b.

According to an embodiment, when the coaxial cable 271 has a structure of transferring high-frequency signals for wireless communication, the position where the conductive gasket 273a is coupled or the position of the first stripped portion 271b may differ from the position which is $\frac{1}{4}\lambda$ away from one end of the coaxial cable 271. Here, '$\lambda$' may refer, for example, to the resonant frequency wavelength of the high-frequency signal transferred through the coaxial cable 271. In an embodiment, according to the position of the first stripped portion 271b, a parasitic resonance may be generated in the coaxial cable 271 in the process of transferring a high-frequency signal, reducing the power efficiency or the signal transmission efficiency of the coaxial cable or increasing the noise of the transmitted signal. In various embodiments of the disclosure, the first stripped portion 271b may be formed at a point different from the 214 distance from one end of the coaxial cable 271, suppressing noise while having good signal transmission efficiency in transmission of high-frequency signals.

According to an embodiment, the antenna module 277 may be disposed adjacent to the position of the fixing member 273, in the side structure 210. In various embodiments, the antenna module 277 may include the second clamp 277c extending from at least one side and, together with the fixing member 273 (e.g., the first clamp 273b), be disposed or fixed to the side structure 210 by one fastening member 291. In an embodiment, the second clamp 277c may be provided separately from the antenna module 277 and, in a state of surrounding at least a portion of the antenna substrate (e.g., the antenna substrate 277a of FIG. 5), the second clamp 277c, together with the antenna module 277 and/or the fixing member 273 (e.g., the first clamp 273b), may be disposed or fixed to the side structure 210. The structure in which the antenna module 277 is disposed or fixed to the side structure 210 is described in greater detail with reference to the embodiment illustrated by way of non-limiting example in FIG. 15. According to an embodiment, since the antenna module 277 is disposed in a position separate from the coaxial cable 271 or the fixing member 273 (e.g., the conductive gasket 273a), the antenna module 277, the coaxial cable 271, and/or the conductive gasket 273a may be assembled in various orders.

Figure 11:
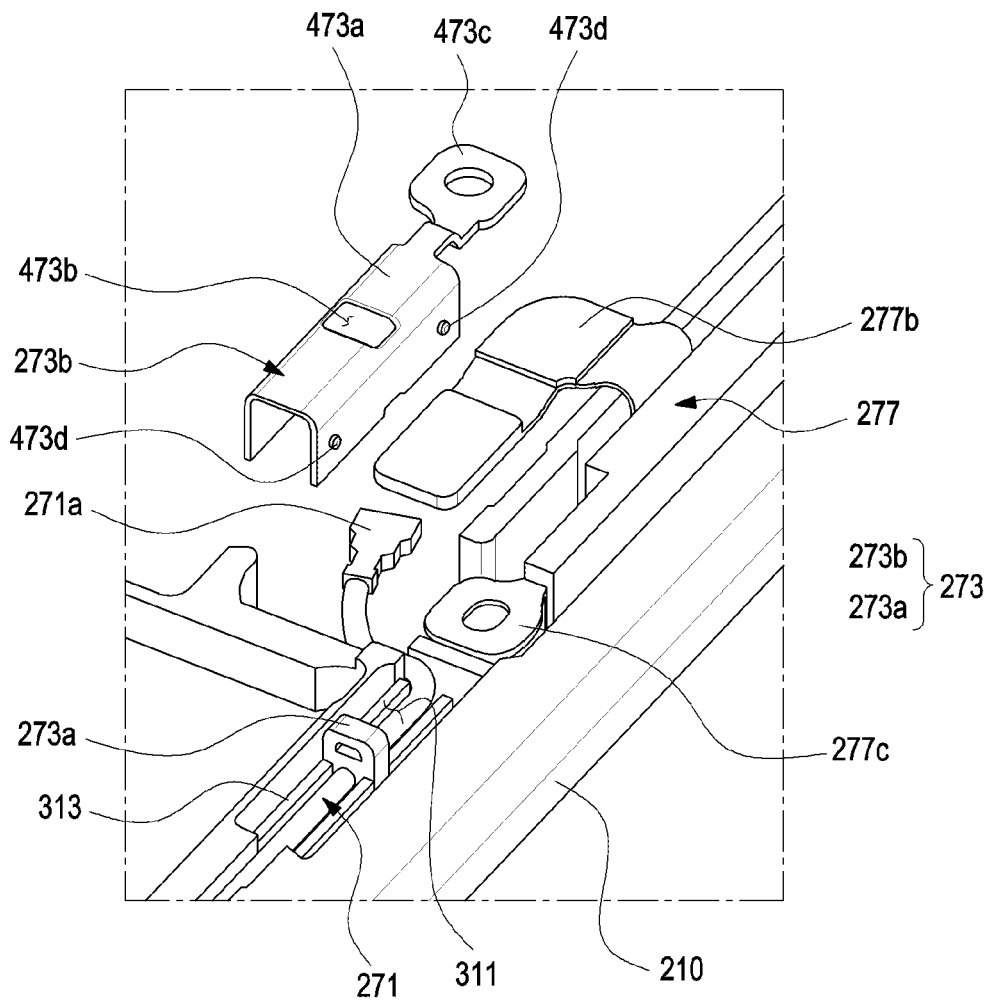
FIG. 11 is an exploded perspective view illustrating a placement of another portion of a fixing member of an electronic device.
Figure 12:
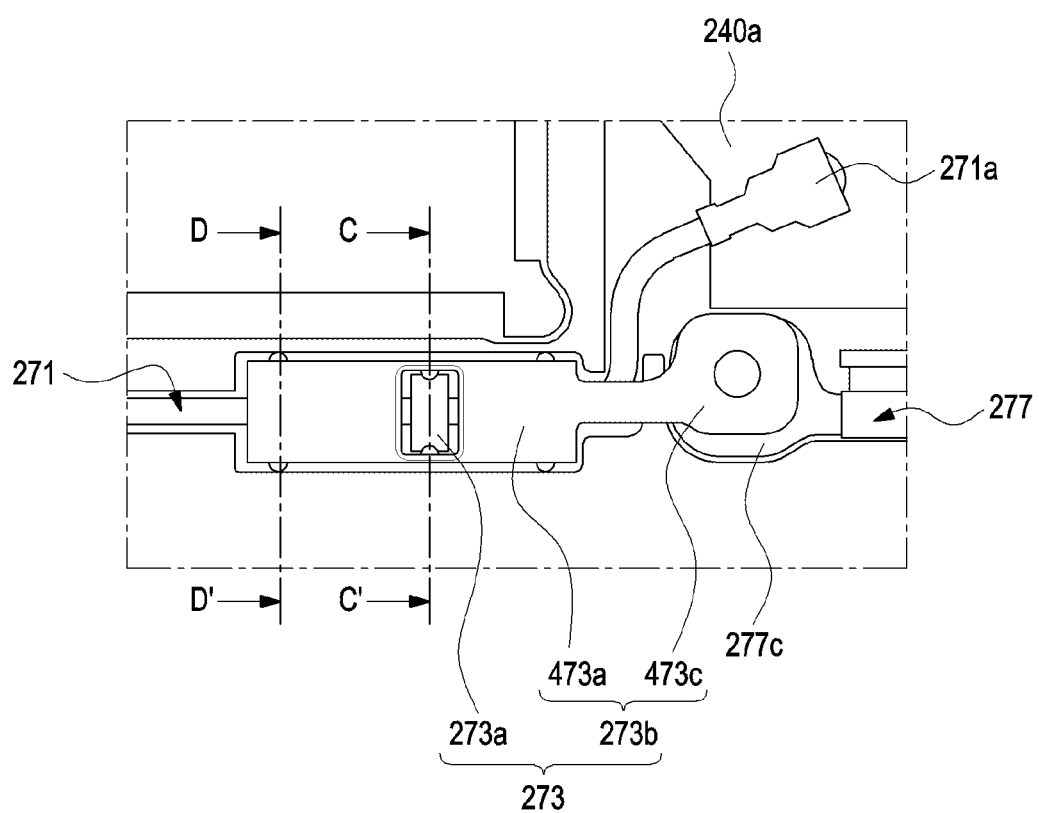
FIG. 12 is a diagram illustrating a placement of another portion of a fixing member of an electronic device.
Figure 13:
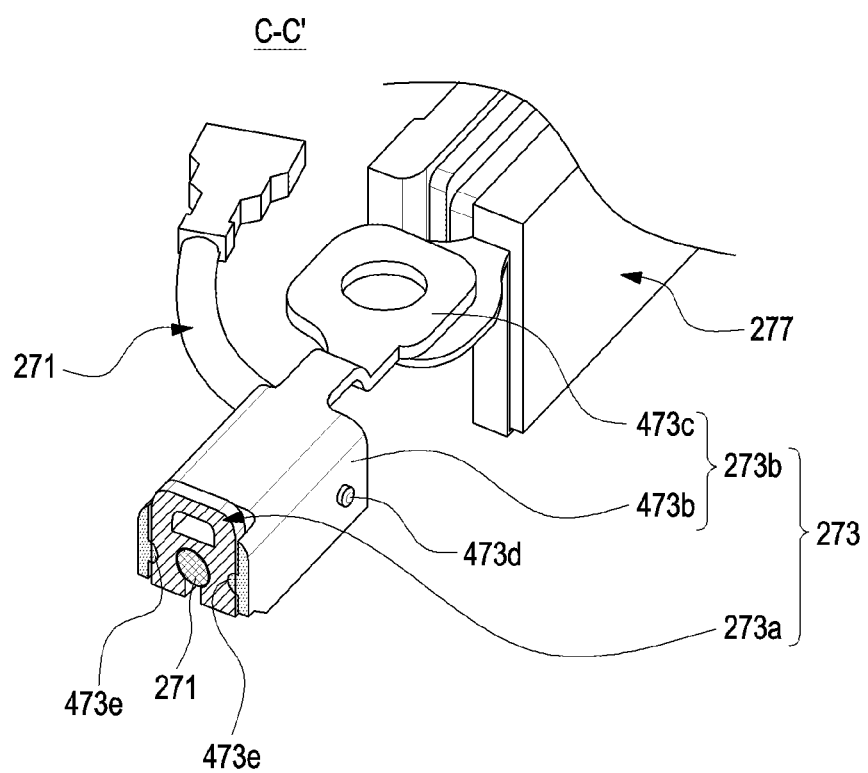
FIG. 13 is a partial perspective sectional view illustrating a fixing member taken along line C-C' of FIG. 12.
Figure 14:
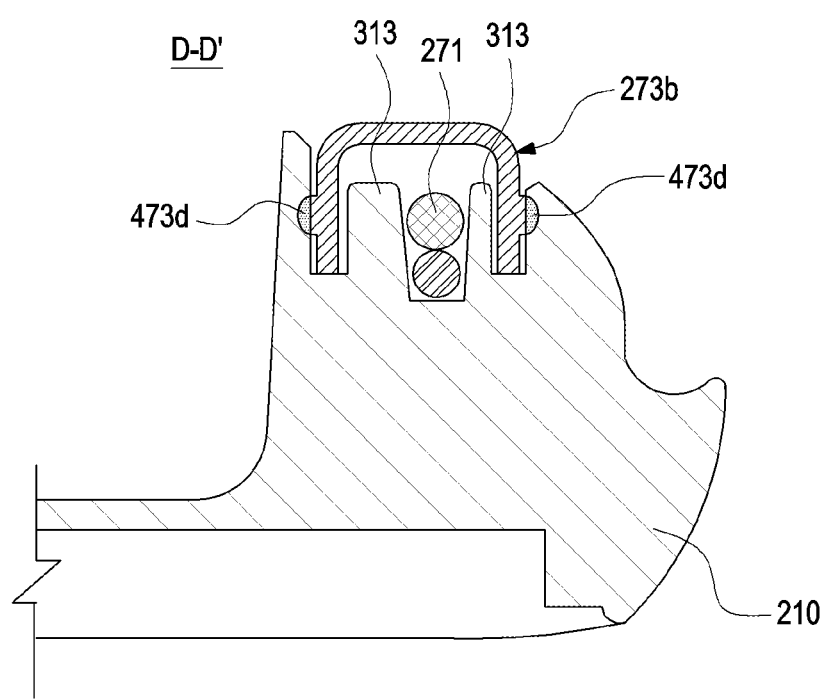
FIG. 14 is a cross-sectional view illustrating a portion of an electronic device, taken along line D-D' of FIG. 12.

FIG. 11 is an exploded perspective view illustrating a placement of another portion (e.g., the first clamp 273b) of a fixing member 273 of an electronic device 200 according to various embodiments. FIG. 12 is a diagram illustrating a placement of another portion of a fixing member 273 of an electronic device 200 according to various embodiments. FIG. 13 is a partial cross-sectional perspective view illustrating a fixing member 273 taken along line C-C' of FIG. 12 according to various embodiments. FIG. 14 is a cross-sectional view illustrating a portion of an electronic device 200, taken along line D-D' of FIG. 12.

Referring to FIGS. 11, 12, 13 and 14 (which may be referred to as FIGS. 11 to 14), the fixing member 273, e.g., the first clamp 273b, may be disposed in the slot 311 in a state of receiving at least a portion of the conductive gasket 273a. In an embodiment, the first clamp 273b may at least partially be press-fitted between the inner wall of the slot 311 and the partition 313. In various embodiments, as the first clamp 273b includes pressurizing protrusion(s) 473d and 473e formed on the outer surface and/or inner surface, it is possible to securely bind the first clamp 273b between the partition 313 and the inner wall of the slot 311 or pressurize the conductive gasket 273a. For example, the first clamp 273b includes the pressurizing protrusion(s) 473d and 473e and may thus be securely fitted into the slot 311 while pressurizing the conductive gasket 273a in tight contact with the coaxial cable 271.

According to an embodiment, the first clamp 273b may include a first fixing portion 473a received in the slot 311 and a second fixing portion 473c extending from at least one side of the first fixing portion 473a. According to an embodiment, at least a portion of the edge of the first fixing portion 473a may be substantially bound between the partition 313 and the inner wall of the slot 311, and the pressurizing protrusion(s) 473d and 473e may be formed substantially on the outer surface or inner surface of the first fixing portion 473a. In various embodiments, the second fixing portion 473c may at least partially be disposed to face the surface of the side structure 210, and the fastening member 291 (see FIG. 15) may be bound through the second fixing portion 473c to the side structure 210. In various embodiments, when the antenna module 277 or another electrical/electronic component is disposed adjacent to the fixing member 273 and is fixed by the second clamp 277c, the second clamp 277c may at least partially be disposed between the second fixing portion 473c and the side structure 210. In an embodiment, a portion (e.g., the second fixing portion 473c) of the first clamp 273b may be disposed between the second clamp 277c and the side structure 210. For example, as is described in connection with FIG. 15, the fastening member 291 may be fastened through the second fixing portion 473c and the second clamp 277c to the side structure 210, and one fastening member 291 may dispose or fix the fixing member 273 or the antenna module 277 on the side structure 210. Accordingly, the fastening member 291 and/or the pressurizing protrusions 473d and 473e pressurizing the conductive gasket 273a may substantially dispose or fix the first clamp 273b, conductive gasket 273a, and/or coaxial cable 271 in the slot 311.

According to an embodiment, the fixing member 273 may further include an opening portion 473b formed through the first clamp 273b (e.g., the first fixing portion 473a). The opening portion 473b may expose, e.g., a portion of the conductive gasket 273a, to the outside of the slot 311 or the first clamp 273b and, in the portion exposed through the opening portion 473b, the conductive gasket 273a may contact the flexible printed circuit board (e.g., the flexible printed circuit board 275b of FIG. 4) or the rear plate (e.g., the rear plate 280 of FIG. 4). Since the conductive gasket 273a is disposed in contact or tight contact with the side structure 210 (e.g., the bottom of the slot 311), the coaxial cable 271 or the flexible printed circuit board 275b may substantially be connected to the housing 201 (e.g., the side structure 210) by the conductive gasket 273a. In various embodiments, when the first clamp 273b has high electrical conductivity, the coaxial cable 271 or the flexible printed circuit board 275b may be electrically connected to the housing 201 through an additional path that passes through the first clamp 273b.

Figure 15:
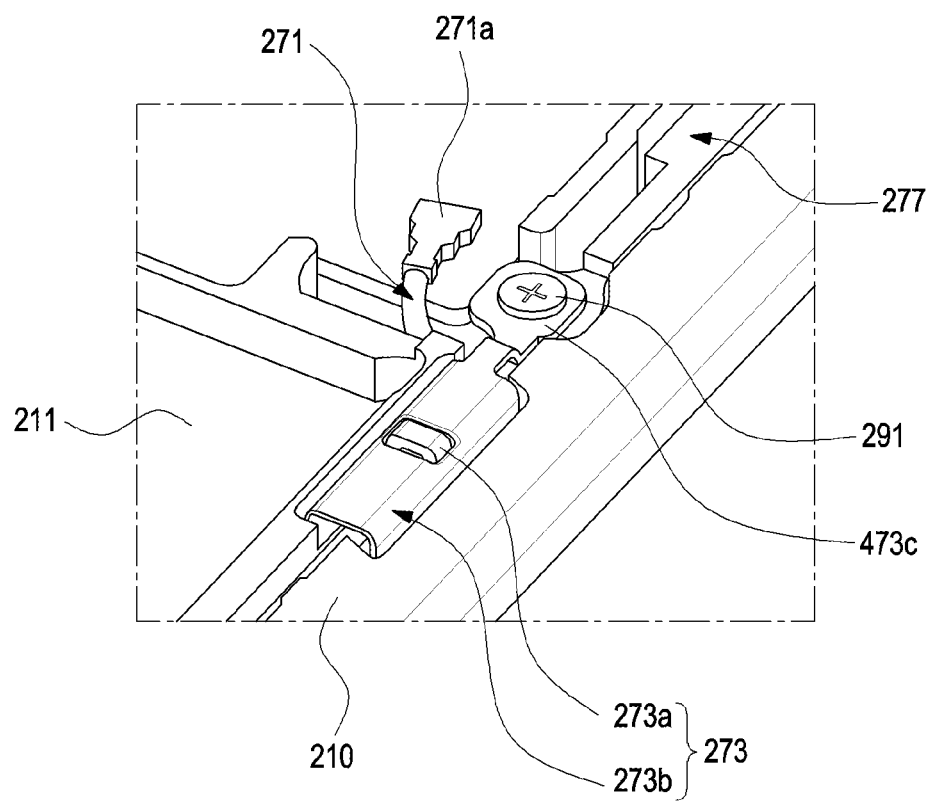
FIG. 15 is a perspective view illustrating a state in which a fastening member is bound in an electronic device.
Figure 16:
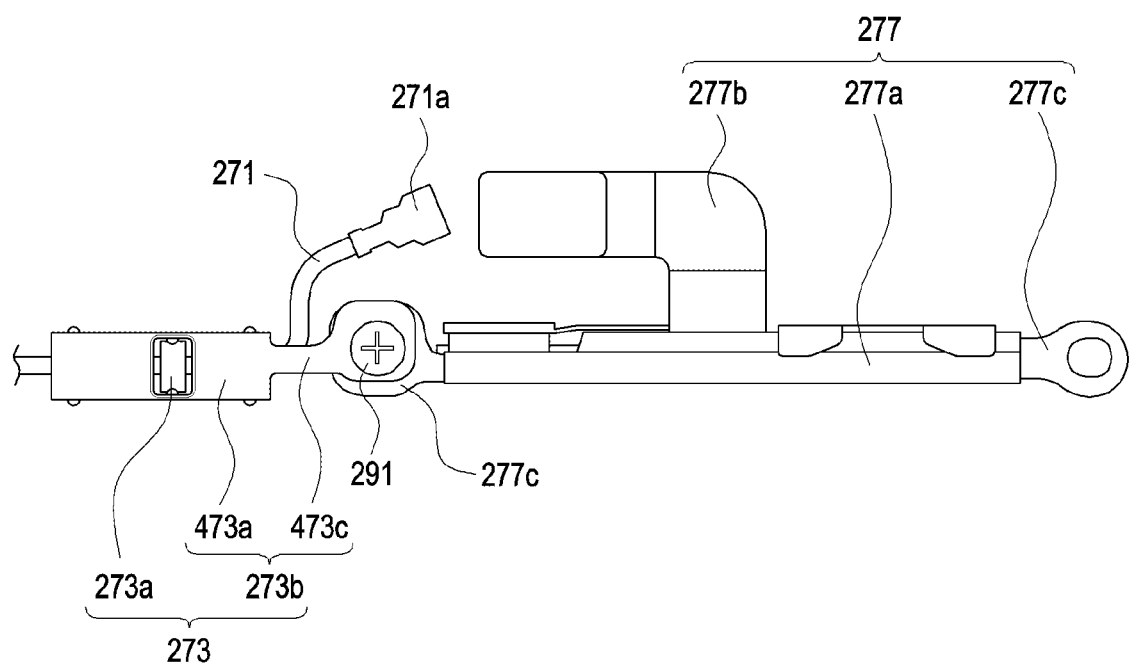
FIG. 16 is a diagram illustrating a state in which a fastening member is bound in an electronic device.
Figure 17:
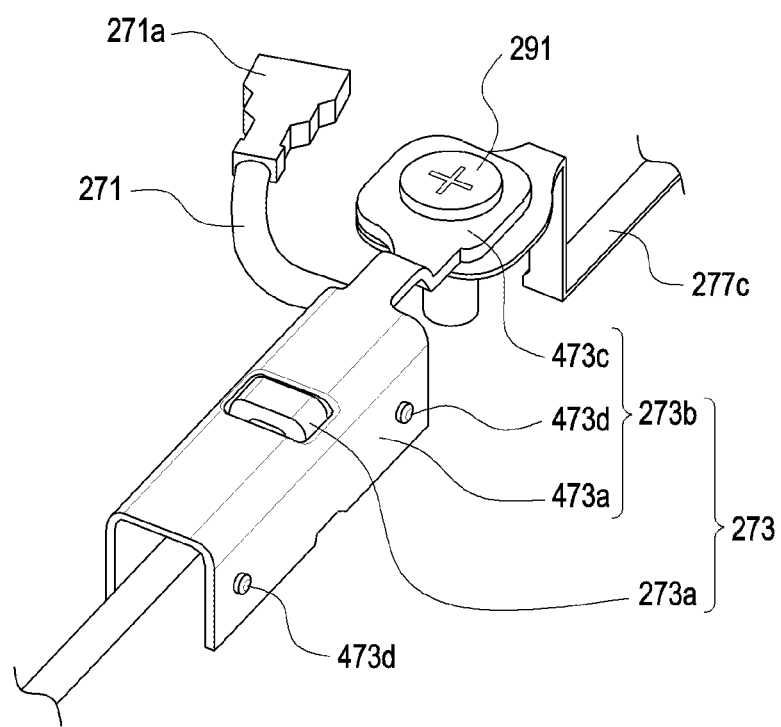
FIG. 17 is a perspective view illustrating a state in which a fastening member is bound in an electronic device.

FIG. 15 is a perspective view illustrating a state in which a fastening member 291 is bound in an electronic device 200 according to various embodiments. FIG. 16 is a diagram illustrating a state in which a fastening member 291 is bound in an electronic device 200 according to various embodiments. FIG. 17 is a perspective view illustrating a state in which a fastening member 291 is bound in an electronic device 200 according to various embodiments.

Referring to FIGS. 15, 16 and 17 (which may be referred to as FIGS. 15 to 17), when the antenna module 277 or another electrical/electronic component (e.g., the fingerprint sensor 275 or camera 279 of FIG. 3) is disposed adjacent, the fixing member 273, together with the other electrical/electronic component or the antenna module 277, may be disposed or fixed to the housing 201 (e.g., the side structure 210) by one fastening member 291. In the illustrated embodiment, the antenna module 277 may be disposed adjacent to the fixing member 273, and the antenna module 277 may be received in another area or space provided by, e.g., the slot 311 of FIG. 6 or 7.

As described in connection with FIG. 5, the antenna module 277 may include an antenna substrate 277a and a wiring board 277b extending from the antenna substrate 277a, and the wiring board 277b may be formed substantially integrally with the antenna substrate 277a, thus having higher flexibility than the antenna substrate 277a. According to an embodiment, an additional antenna module (e.g., the antenna module 277' of FIG. 5) may further be disposed in a position different from that in the illustrated embodiment. According to an embodiment, the antenna module 277 may be fixed to the side structure 210 by the second clamp 277c and/or fastening member 291 respectively extending from two opposite sides of the antenna substrate 277a. Accordingly, the coaxial cable 271, together with the other adjacent electrical/electronic component or the antenna module 277, may be electrically connected to the common ground (e.g., the housing or side structure). In an embodiment, the second clamp 277c is a portion of the structure surrounding at least a portion of the antenna substrate (e.g., the antenna substrate 277a of FIG. 5) and may protrude or extend from at least one side of the antenna substrate.

Figure 18:
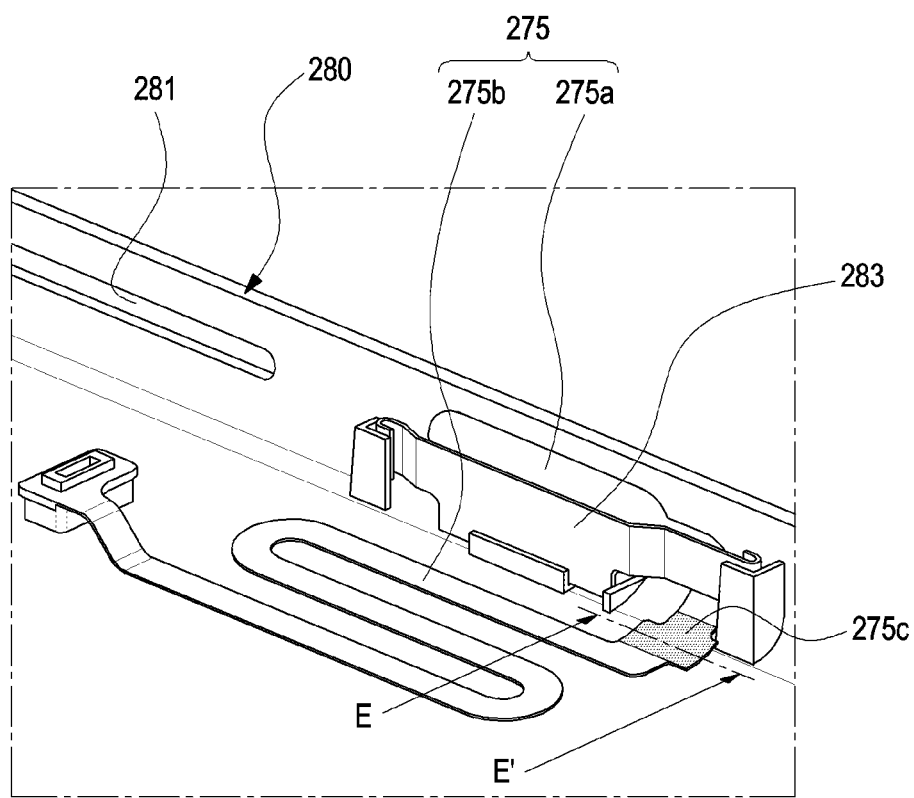
FIG. 18 is a partial perspective view illustrating a placement of an electrical/electronic component in an electronic device.
Figure 19:
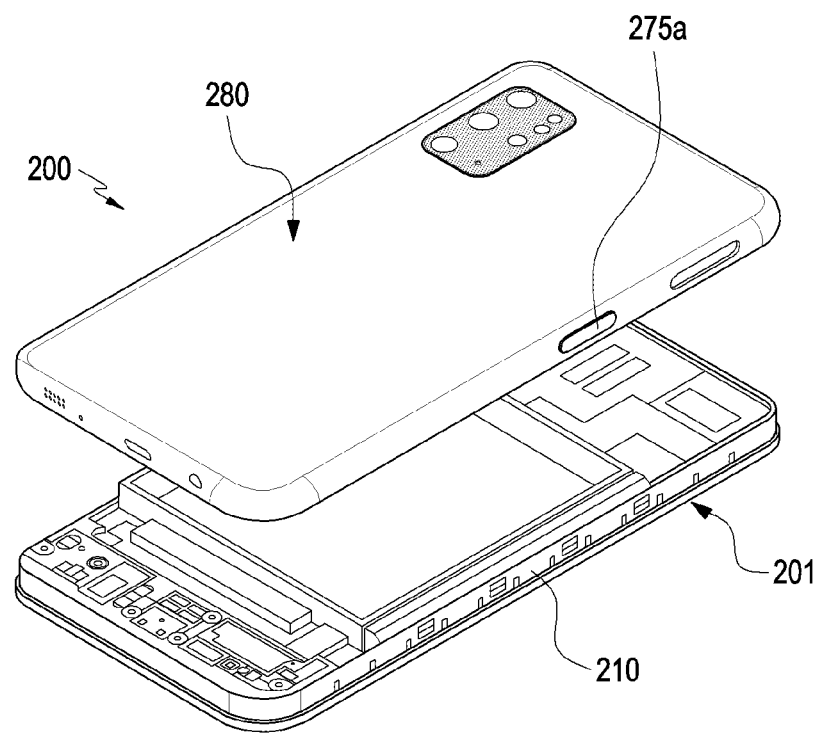
FIG. 19 is an exploded perspective view illustrating a coupling of a housing and a rear plate in an electronic device.
Figure 20:
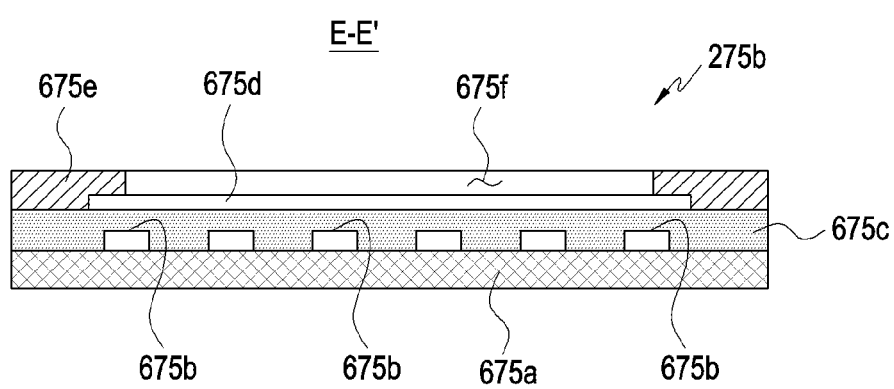
FIG. 20 is a cross-sectional view illustrating a portion of a flexible printed circuit board, taken along line E-E' of FIG. 18.

FIG. 18 is a perspective view illustrating a placement of an electrical/electronic component 275 (e.g., a fingerprint sensor) in an electronic device 200 according to various embodiments. FIG. 19 is an exploded perspective view illustrating a coupling of a housing 201 and a rear plate 280 in an electronic device 200 according to various embodiments. FIG. 20 is a cross-sectional view illustrating a portion of a flexible printed circuit board 275b, taken along line E-E' of FIG. 18 according to various embodiments.

In the embodiment of FIGS. 18, 19 and 20 (which may be referred to as FIGS. 18 to 20), the rear plate 280 may be shaped to surround a portion of the side structure 210. For example, while the side surface 110c of the electronic device 100 or the housing 110 is substantially formed by the side structure 210 of FIG. 3 in the embodiment of FIG. 1 or 2, at least a portion of the side surface of the electronic device 200 may be formed by the rear plate 280 in the embodiment of FIGS. 18 to 20. Such a difference in shape may be appropriately selected considering the outer appearance of the electronic device (e.g., the electronic device 100 of FIG. 1 or the electronic device 200 of FIG. 19) or the arrangement of electrical/electronic components inside.

Referring to FIGS. 18 to 20, the electronic device 200 may further include at least one electrical/electronic component 275 disposed adjacent to the coaxial cable (e.g., the coaxial cable 271 of FIGS. 3 to 5 or FIG. 11) or the fixing member (e.g., the fixing member 273 of FIGS. 3 to 5 or FIG. 11). In an embodiment, the electrical/electronic component 275 may include a fingerprint sensor and, according to an embodiment, another electrical/electronic component, not a fingerprint sensor, may be disposed adjacent to the coaxial cable 271 or the fixing member 273. In various embodiments, the electrical/electronic component 275 may include a body portion 275a where a sensing element is disposed and a flexible printed circuit board 275b extending from the body portion 275a. The 'sensing element' may include at least one of an optical element, an ultrasonic element, a transparent electrode, and a load cell, and may detect information about the user's fingerprint, approach by the user's body, contact by the user's body, and/or external environment (e.g., illuminance).

According to an embodiment, the electrical/electronic component 275 may be disposed on the rear plate 280. However, various embodiments of the disclosure are not limited thereto, and similarly to the antenna module 277, the electrical/electronic component 275 may be disposed on the side structure 210. In the illustrated embodiment, the rear plate 280 may have a shape surrounding a portion of the side structure 210, and the electrical/electronic component 275 may be disposed substantially on a portion of the side structure 210. In various embodiments, when shaped to surround a portion of the side structure 210, the rear plate 280 may provide at least a portion of the side surface (e.g., the side surface 110C of FIG. 1) of the housing 201 or the electronic device 200. According to an embodiment, when shaped to surround a portion of the side structure 210, the rear plate 280 may include a key hole 281 and/or a fixing piece 283, and a key input device (e.g., the key input device 117 of FIG. 1 or 2) may be disposed through the key hole 281. The key input device 117 may be one of the electrical/electronic components mentioned in the embodiment. For example, similar to the embodiment described below, the key input device 117 disposed in the key hole 281 may be electrically connected with the housing 201 through the fixing member 273 and be thereby provided with a ground. The fixing piece 283 may be disposed on the inner surface of the rear plate 280 and may fix the body portion 275a of the electric/electronic component 275 to the inner surface of the rear plate 280. In various embodiments, the body portion 275a may be exposed to the outside of the rear plate 280 and directly contact the user's body. In an embodiment, the body portion 275 may be visually exposed to the outside but may not contact the user's body. In an embodiment, the body portion 275a may be exposed to the external space and contact the user's body but may not be visually recognized by the user. A configuration related to exposure or concealment to the external space may be appropriately selected depending on the function or the manner of implementing the function, assigned to the electrical/electronic component 275.

According to an embodiment, the flexible printed circuit board 275b may extend from the body portion 275a and be disposed substantially on the inner surface of the rear plate 280. In various embodiments, the flexible printed circuit board 275b may be substantially disposed between the side structure 210 and the rear plate 280 or between a second supporting member (e.g., the second supporting member 260 of FIG. 3) and the rear plate 280. In an embodiment, an end of the flexible printed circuit board 275b may pass through the second supporting member 260 to be mechanically or electrically coupled to the printed circuit board (e.g., the first circuit board 240a of FIG. 3).

According to an embodiment, similar to the first striped portion (e.g., the first striped portion 271b of FIG. 8) of the coaxial cable (e.g., the coaxial cable 271 of FIG. 8), the flexible printed circuit board 275b may include a second stripped portion 275c. The flexible printed circuit board 275b may include a plurality of insulation layers 675a, 675c, and 675e, and a plurality of wiring layers. According to an embodiment, among the wiring layers, a first wiring layer may include a plurality of signal lines 675b formed between, e.g., a first insulation layer 675a and a second insulation layer 675c. Among the wiring layers, a second wiring layer may be, e.g., a ground layer 675d (or ground line) formed between the second insulation layer 675c and a third insulation layer 675e. According to an embodiment, the flexible printed circuit board 275b may include an additional wiring layer or additional insulation layer (not shown), which may be varied depending on the function and manner of implementing the function, assigned to the electrical/electronic component 275 (e.g., the body portion 275b).

According to an embodiment, the second stripped portion 275c may include an exposure area 675f that exposes a portion of the ground layer 675d to the external space. For example, as a portion of the third insulation layer 675e is removed, a portion of the ground layer 675d may be exposed to the external space. In an embodiment, if the rear plate 280 is coupled to the housing 201 (e.g., the side structure 210), the second stripped portion 275c and/or the exposure area 675f may substantially be disposed to face the fixing member 273 (e.g., the conductive gasket 273a of FIG. 4 or 5). For example, the ground layer 675d of the flexible printed circuit board 275b may be electrically connected with the housing 201 substantially through the conductive gasket 273a. Accordingly, the electrically conductive portion 275 or the flexible printed circuit board 275b, together with the coaxial cable 271 and/or the antenna module 277, may be electrically connected substantially with the housing 201 or the side structure 210 and may thus be provided with the common ground. For example, the electrical/electronic component 275, the flexible printed circuit board 275b, the coaxial cable 271, and/or the antenna module 277 may be electrically connected to the printed circuit board (e.g., the printed circuit board 240a and 240b (e.g., ground) of FIG. 3) via the housing 201 or the side structure 210.

As described above, according to an example embodiment of the disclosure, an electronic device (e.g., the electronic device 100 or 200 of FIGS. 1 to 5) may comprise: a housing (e.g., the housing 201 of FIG. 3 or 4) including a front surface (e.g., the first surface 110A of FIG. 1) facing a first direction, a rear surface (e.g., the second surface 110B of FIG. 2) facing in a second direction opposite to the front direction, and a side structure (e.g., the side structure 210 of FIGS. 3 to 5) including a side surface at least partially surrounding a space between the front surface and the rear surface, a coaxial cable (e.g., the coaxial cable 271 of FIGS. 3 to 5) at least partially disposed in the housing, a fixing member comprising a conductive material (e.g., the fixing member 273 of FIGS. 3 to 5) having electrical conductivity and disposed in the housing surrounding at least a portion of the coaxial cable, and an electrical/electronic component (e.g., the electrical/electronic component 275 of FIG. 3 or 18) disposed in the housing and including a body portion (e.g., the body portion 275a of FIGS. 3 to 18) at least partially disposed in the housing and a flexible printed circuit board (e.g., the flexible printed circuit board 275b of FIG. 3 or 5) extending from the body portion. The fixing member may be configured to electrically connect the coaxial cable and the flexible printed circuit board with the housing.

According to an example embodiment, the fixing member may be fixed to the side structure, and the flexible printed circuit board may be disposed to contact the fixing member between the rear surface and the side structure.

According to an example embodiment, the flexible printed circuit board may be disposed to at least partially face a surface of the side structure with the fixing member disposed therebetween.

According to an example embodiment, the electronic device may further comprise: at least one printed circuit board (e.g., the printed circuit board 240a and 240b of FIG. 3 or 5) received in a space between the front surface and the rear surface and including a ground. The housing may be electrically connected with the ground of the printed circuit board.

According to an example embodiment, the fixing member may include a conductive gasket (e.g., the conductive gasket 273a of FIGS. 3 to 5) comprising an elastic material. The conductive gasket may be coupled to at least partially surround an outer circumferential surface of the coaxial cable and is disposed to contact the side structure.

According to an example embodiment, the fixing member may include a conductive gasket comprising an elastic material and coupled to at least partially surround an outer circumferential surface of the coaxial cable and a first clamp (e.g., the first clamp 273b of FIGS. 3 to 5) coupled to the conductive gasket and configured to pressurize at least a portion of the conductive gasket. At least a portion of the first clamp may be bound or fixed to the side structure.

According to an example embodiment, the fixing member may further include an opening portion (e.g., the opening portion 473b of FIG. 11) formed through the first clamp. A portion of the conductive gasket may be disposed to contact the flexible printed circuit board through the opening portion.

According to an example embodiment, the side structure may include at least one slot (e.g., the slot 311 of FIG. 5 or 6) formed in at least a portion of a surface facing the rear surface. At least one of the coaxial cable, the conductive gasket, or the first clamp may be at least partially received in the at least one slot.

According to an example embodiment, the conductive gasket may include a binding recess (e.g., the binding recess 373a of FIG. 8) receiving a portion of the coaxial cable and a dummy hole (e.g., the dummy hole 373b of FIG. 8) in parallel with the binding recess.

According to an example embodiment, the electronic device may further comprise an antenna module (e.g., the antenna module 277 of FIG. 3, 5, or 11) including an antenna disposed on the side structure and including at least one second clamp (e.g., the second clamp 277c of FIG. 11) extending to a side. A portion of any one of the first clamp and the second clamp may be bound to the side structure, with a portion of the other one of the first clamp and the second clamp disposed therebetween, forming an electrical connection between the coaxial cable and the side structure.

According to an example embodiment, the antenna module may be disposed to face an external space of the housing along a direction parallel to the front surface or the rear surface.

According to an example embodiment, the electronic device may further comprise a fastener (e.g., the fastening member 291 of FIG. 3 or 15) bound to the side structure through a portion of the first clamp and a portion of the second clamp.

According to an example embodiment, the electronic device may further comprise: a rear plate (e.g., the rear plate 280 of FIG. 3, 4, or 18) coupled to face at least a portion of the side structure and configured to provide at least a portion of the rear surface and at least one slot formed in a surface of the side structure in an area at least partially facing the rear plate. As at least a portion of the fixing member is received in the slot, another portion of the fixing member may be disposed to face the rear plate, and the flexible printed circuit board may be configured to be disposed on an inner surface of the rear plate to contact the fixing member.

According to an example embodiment, the electrical/ electronic component may include at least one of a fingerprint sensor, a key input device, a touch sensor, a pressure sensor, or a grip sensor.

According to an example embodiment of the disclosure, an electronic device (e.g., the electronic device 100 or 200 of FIGS. 1 to 5) may comprise: a rear plate (e.g., the rear plate 280 of FIG. 3, 4, or 18), a frame-shaped side structure (e.g., the side structure 210 of FIGS. 3 to 5) including a side surface disposed corresponding to an edge of the rear plate, a coaxial cable (e.g., the coaxial cable 271 of FIGS. 3 to 5) at least partially disposed on the side structure in an area facing the rear plate, a fixing member comprising a conductive material (e.g., the fixing member 273 of FIGS. 3 to 5) disposed on the side structure surrounding at least a portion of the coaxial cable, and an electrical/electronic component (e.g., the electrical/electronic component 275 of FIG. 3 or 18) disposed in the housing and including a body portion (e.g., the body portion 275a of FIG. 3 or 18) at least partially disposed on the rear plate and a flexible printed circuit board (e.g., the flexible printed circuit board 275b of FIG. 3 or 5) extending from the body portion and configured to be disposed on an inner surface of the rear plate to contact the fixing member. The fixing member may be configured to electrically connect the coaxial cable and the flexible printed circuit board with the side structure.

According to an example embodiment, the fixing member may include a conductive gasket (e.g., the conductive gasket 273a of FIGS. 3 to 5) comprising an elastic material and coupled to at least partially surround an outer circumferential surface of the coaxial cable, a clamp (e.g., the first clamp 273b of FIGS. 3 to 5) coupled to the conductive gasket and configured to pressurize at least a portion of the conductive gasket and having at least a portion bound or fixed to the side structure, and an opening portion (e.g., the opening portion 473b of FIG. 11) formed through the clamp. A portion of the conductive gasket may contact the flexible printed circuit board through the opening portion.

According to an example embodiment, the clamp may include at least one first pressurizing protrusion (e.g., the pressurizing protrusion indicated by '473e' of FIG. 13) contacting the conductive gasket.

According to an example embodiment, the electronic device may further comprise: at least one slot (e.g., the slot 311 of FIG. 5 or 6) formed in the side structure in an area facing the rear plate and a plurality of partitions (e.g., the partition 313 of FIG. 7 or 14) formed in an inner space of the slot. The coaxial cable may be disposed between the plurality of partitions. A portion of the fixing member may be bound between at least one of the partitions and an inner wall of the slot.

According to an example embodiment, the fixing member may include at least one second pressurizing protrusion (e.g., the pressurizing protrusion indicated by '473d' of FIG. 13 or 14) contacting the inner wall of the slot.

According to an example embodiment, the electronic device may further comprise a printed circuit board (e.g., the printed circuit board 240a and 240b of FIG. 3 or 5) received in a space or an area surrounded by the side structure. The coaxial cable or the flexible printed circuit board may be electrically connected with the printed circuit board through the fixing member and the side structure.

While the disclosure has been described and shown in connection with various example embodiments, it should be appreciated that various embodiments are not intended as limiting the disclosure but as illustrative. It will be apparent to one of ordinary skill in the art that various changes may be made in form and detail without departing from the overall scope of the disclosure, including the appended claims and their equivalents. For example, although the electric/electronic component and the antenna module (e.g., the antenna module 277 of FIG. 3) are separately described, various embodiments of the disclosure are not limited thereto, and the antenna module 277 may be one of the electrical/electronic components included in the electronic device (e.g., the electronic device 100 or 200 of FIGS. 1 to 5). In the above-described embodiments, as an electrical/electronic component electrically connected to the housing (e.g., the housing 201 of FIGS. 3 to 5) by the fixing member (e.g., the fixing member 273 of FIGS. 3 to 5), a fingerprint sensor or a flexible printed circuit board of the fingerprint sensor is illustrated by way of non-limiting example, but other various types of electrical/electronic components, such as proximity sensors, illuminance sensors, grip sensors, touch sensors, and/or pressure sensors, may be electrically connected with the housing through the fixing member. It will also be understood that any of the embodiment(s) described herein may be used in conjunction with any other embodiment(s) described herein.

What is claimed is:

1. An electronic device comprising:
    a housing including a front surface facing a first direction, a rear surface facing a second direction opposite to the first direction, and a side structure including a side surface at least partially surrounding a space between the front surface and the rear surface;
    a coaxial cable at least partially disposed in the housing;
    a fixing member, comprising a conductive gasket, having electrical conductivity and disposed in the housing in a state of surrounding at least a portion of the coaxial cable; and
    an electrical/electronic component disposed in the housing and including a body portion at least partially disposed in the housing and a flexible printed circuit board extending from the body portion,
    wherein the fixing member includes a conductive gasket comprising an elastic material and coupled to at least partially surround an outer circumferential surface of the coaxial cable, and a clamp coupled to the conductive gasket and configured to pressurize at least a portion of the conductive gasket,
    wherein at least a portion of the clamp is bound or fixed to the side structure,
    wherein the conductive gasket includes a binding recess configured for receiving a portion of the coaxial cable, and a dummy hole formed in parallel with the binding recess, and
    wherein the fixing member is configured to electrically connect the coaxial cable and the flexible printed circuit board with the housing.

2. The electronic device of claim 1, wherein the fixing member is fixed to the side structure, and wherein the flexible printed circuit board is disposed to contact the fixing member between the rear surface and the side structure.

3. The electronic device of claim 1, wherein the flexible printed circuit board is disposed to at least partially face a surface of the side structure with the fixing member disposed therebetween.

4. The electronic device of claim 1, further comprising at least one printed circuit board received in a space between the front surface and the rear surface and including a ground,
    wherein the housing is electrically connected with the ground of the printed circuit board.

5. The electronic device of claim 1,
    wherein the conductive gasket is coupled to at least partially surround an outer circumferential surface of the coaxial cable and is disposed to contact the side structure.

6. The electronic device of claim 1, wherein the fixing member further includes an opening portion formed through the clamp, and
    wherein a portion of the conductive gasket is disposed to contact the flexible printed circuit board through the opening portion.

7. The electronic device of claim 1, wherein the side structure includes at least one slot formed in at least a portion of a surface facing the rear surface, and
    wherein at least one of the coaxial cable, the conductive gasket, or the first clamp is at least partially received in the at least one slot.

8. The electronic device of claim 1, further comprising:
a rear plate coupled to face at least a portion of the side structure and configured to provide at least a portion of the rear surface; and
at least one slot formed in a surface of the side structure in an area at least partially facing the rear plate,
wherein as at least a portion of the fixing member is received in the slot, another portion of the fixing member is disposed to face the rear plate, and the flexible printed circuit board is disposed on an inner surface of the rear plate to contact the fixing member.

9. The electronic device of claim 1, wherein the electrical/electronic component includes at least one of a fingerprint sensor, a key input device, a touch sensor, a pressure sensor, or a grip sensor.

10. The electronic device of claim 1, wherein the clamp comprises a first clamp, the electronic device further comprising an antenna module including at least one antenna disposed on the side structure and including at least one second clamp extending to a side,
wherein a portion of any one of the first clamp and the second clamp is bound to the side structure, with a portion of the other one of the first clamp and the second clamp disposed therebetween, forming an electrical connection between the coaxial cable and the side structure.

11. The electronic device of claim 10, wherein the antenna module is disposed to face an external space of the housing along a direction parallel to the front surface or the rear surface.

12. The electronic device of claim 10, further comprising a fastener bound to the side structure through a portion of the first clamp and a portion of the second clamp.

13. An electronic device comprising:
a rear plate;
a frame-shaped side structure including a side surface disposed corresponding to an edge of the rear plate;
a coaxial cable at least partially disposed on the side structure in an area facing the rear plate;
a fixing member comprising a conductive material disposed on the side structure surrounding at least a portion of the coaxial cable; and
an electrical/electronic component including a body portion at least partially disposed on the rear plate and a flexible printed circuit board extending from the body portion and disposed on an inner surface of the rear plate to contact the fixing member,
wherein the fixing member includes a conductive gasket comprising an elastic material and coupled to at least partially surround an outer circumferential surface of the coaxial cable, and a first clamp coupled to the conductive gasket and configured to pressurize at least a portion of the conductive gasket,
wherein at least a portion of the first clamp is bound or fixed to the side structure,
wherein the conductive gasket includes a binding recess receiving a portion of the coaxial cable, and a dummy hole formed in parallel with the binding recess, and
wherein the fixing member is configured to electrically connect the coaxial cable and the flexible printed circuit board with the side structure.

14. The electronic device of claim 13, further comprising a printed circuit board received in a space or an area surrounded by the side structure,
wherein the coaxial cable or the flexible printed circuit board is electrically connected with the printed circuit board through the fixing member and the side structure.

15. The electronic device of claim 13, wherein the fixing member further includes:
an opening portion formed through the first clamp, and
wherein a portion of the conductive gasket contacts the flexible printed circuit board through the opening portion.

16. The electronic device of claim 15, wherein the first clamp includes at least one first pressurizing protrusion contacting the conductive gasket.

17. The electronic device of claim 13, further comprising:
at least one slot formed in the side structure in an area facing the rear plate; and
a plurality of partitions formed in an inner space of the slot,
wherein the coaxial cable is disposed between the plurality of partitions, and
wherein a portion of the fixing member is bound between at least one of the partitions and an inner wall of the slot.

18. The electronic device of claim 17, wherein the fixing member includes at least one second pressurizing protrusion contacting the inner wall of the slot.

* * * * *